(12) United States Patent
Miwa

(10) Patent No.: US 10,408,993 B2
(45) Date of Patent: Sep. 10, 2019

(54) LIGHT SOURCE UNIT, LIGHTING DEVICE, AND DISPLAY DEVICE

(71) Applicant: Sharp Kabushiki Kaisha, Sakai, Osaka (JP)

(72) Inventor: Masashi Miwa, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/755,549

(22) PCT Filed: Aug. 26, 2016

(86) PCT No.: PCT/JP2016/074937
§ 371 (c)(1),
(2) Date: Feb. 27, 2018

(87) PCT Pub. No.: WO2017/038667
PCT Pub. Date: Mar. 9, 2017

(65) Prior Publication Data
US 2018/0275336 A1  Sep. 27, 2018

(30) Foreign Application Priority Data
Aug. 31, 2015 (JP) ................................. 2015-170183

(51) Int. Cl.
*F21V 8/00* (2006.01)
*H05K 1/03* (2006.01)
(Continued)

(52) U.S. Cl.
CPC ........... *G02B 6/0083* (2013.01); *G02B 6/005* (2013.01); *G02B 6/0073* (2013.01);
(Continued)

(58) Field of Classification Search
None
See application file for complete search history.

(56) References Cited

U.S. PATENT DOCUMENTS

2007/0236626 A1  10/2007  Koganezawa
2009/0109368 A1*  4/2009  Watanabe ............ G02B 6/0083
                                                     349/58

(Continued)

FOREIGN PATENT DOCUMENTS

JP    H08-264928 A    10/1996
JP    2007-019562 A    1/2007
(Continued)

*Primary Examiner* — Elmito Breval
(74) *Attorney, Agent, or Firm* — ScienBiziP, P.C.

(57) ABSTRACT

A light source unit includes light sources and a light source substrate. Each of the light sources includes terminals. The light source substrate includes a support layer, a wiring portion, mounting portions, an insulating cover layer, locking edges, and solder portions. The support layer has flexibility and an insulating property. The wiring portion is formed on the support layer. Each of the mounting portions includes lands provided midway in the wiring portion and facing each other at a distance. The mounting portions are assigned to the light sources, respectively. The insulating cover layer is formed on the support layer to cover the wiring portion and includes opening edges. The locking edges are formed by sections of the opening edges to overlap the lands in a non-linear manner in a plan view. The solder portions conform and adhere to the locking edges and electrically connect the lands to the terminals.

12 Claims, 16 Drawing Sheets

(51) Int. Cl.
  *H05K 1/11*   (2006.01)
  *H05K 3/34*   (2006.01)
  *H05K 1/18*   (2006.01)
  *H01L 33/48*  (2010.01)

(52) U.S. Cl.
  CPC ......... *G02B 6/0091* (2013.01); *H05K 1/0393* (2013.01); *H05K 1/111* (2013.01); *H05K 3/3442* (2013.01); *H01L 33/486* (2013.01); *H05K 1/189* (2013.01); *H05K 3/3452* (2013.01); *H05K 2201/0154* (2013.01); *H05K 2201/0989* (2013.01); *H05K 2201/09381* (2013.01); *H05K 2201/10106* (2013.01); *H05K 2201/10136* (2013.01)

(56) References Cited

U.S. PATENT DOCUMENTS

| | | | | |
|---|---|---|---|---|
| 2009/0185393 | A1* | 7/2009 | Kang | G02B 6/0073 362/612 |
| 2009/0316063 | A1* | 12/2009 | Watanabe | G02B 6/0088 349/58 |
| 2011/0096265 | A1* | 4/2011 | Murakoshi | G02F 1/133603 349/64 |
| 2011/0128468 | A1 | 6/2011 | Koganezawa | |
| 2012/0057099 | A1* | 3/2012 | Tanuma | G02B 6/0073 349/62 |
| 2012/0250329 | A1* | 10/2012 | Suehiro | G02B 6/0085 362/294 |
| 2012/0262643 | A1* | 10/2012 | Kweon | G02F 1/133308 349/58 |
| 2013/0293810 | A1* | 11/2013 | Ke | F21V 9/40 349/65 |
| 2015/0098248 | A1* | 4/2015 | Wakaki | F21V 23/001 362/611 |
| 2015/0226415 | A1* | 8/2015 | Tanaka | H04N 5/66 348/790 |

FOREIGN PATENT DOCUMENTS

| | | |
|---|---|---|
| JP | 2007-279480 A | 10/2007 |
| WO | 2014/042063 A1 | 3/2014 |

* cited by examiner

LIGHT SOURCE UNIT, LIGHTING DEVICE, AND DISPLAY DEVICE

TECHNICAL FIELD

The present invention relates to a light source unit, a lighting device, and a display device.

BACKGROUND ART

Liquid crystal display devices equipped with a liquid crystal display panel are used in various electronic devices such as smart phones and tablet terminals. In addition to the liquid crystal display panel, the liquid crystal display device includes a lighting device (backlight device) for supplying light to the liquid crystal display panel.

Lighting devices known as edge light (or side light) type are known, in which light sources are disposed opposite an end face of a light guide plate. In this type of lighting device, a plurality of LEDs (Light Emitting Diodes) are mounted in single file on a flexible substrate such as an FPC (Flexible Printed Circuit) and used as a light source unit, as shown in Patent Document 1.

In this light source unit, the anode terminals and cathode terminals of the LEDs are each electrically connected to wiring patterns provided on the flexible substrate by soldering. The wiring patterns are formed on an insulating support base member that forms the flexible substrate, and covered by a cover lay that is an insulating film. The wiring patterns include anode-side wiring patterns connected to anode terminals and cathode-side wiring patterns connected to cathode terminals, and these wiring patterns are exposed through openings formed in the cover lay and soldered to the anode and cathode terminals of the LEDs.

The solder in portions connecting the respective terminals of the LEDs and the wiring patterns is positioned inside the openings in such a way as to adhere to the edges of the openings in the cover lay.

CITATION LIST

Patent Document

Patent Document 1: WO 2014/042063

Problem to be Solved by the Invention

In conventional light source units, the openings provided in the cover lay have a shape conforming to the shape of the LEDs. For example, an opening for mounting a rectangular parallelepiped LED is substantially rectangular in a plan view. Accordingly, LEDs are usually fixed on the flexible substrate, with the solder in portions connecting respective terminals with the wiring patterns adhering to straight line edges of the openings.

In such light source units, when an external force is applied, the stress can easily concentrate on portions where the LEDs are mounted, and sometimes cracks would form between the edges of the openings in the cover lay and the solder. Such cracks between the edges of the openings and the solder could eventually cause the LED terminals to lift up together with the solder from the flexible substrate and cause the solder to separate from the wiring pattern, resulting in a conduction failure.

DISCLOSURE OF THE PRESENT INVENTION

An object of the present invention is to provide a light source unit or the like that can reduce occurrence of conduction failures in mounting portions of the light sources.

Means for Solving the Problem

A light source unit according to the present invention includes: a plurality of light sources each including a pair of terminals and aligned in a row; and a light source substrate including a flexible and insulating support layer, a wiring portion formed on the support layer and supplying power to the light sources, a plurality of mounting portions that each include a pair of lands provided midway in the wiring portion and facing each other at a distance, and that are each assigned to each of the light sources, an insulating cover layer formed on the support layer in such a way as to cover the wiring portion and including a plurality of opening edges for exposing the mounting portions, locking edges formed by sections of the opening edges and overlapping the lands in a non-linear manner in a plan view in each of the lands, and solder portions conforming and adhering to the locking edges and electrically connecting the lands and the terminals. With the configuration specified above, occurrence of conduction failures in mounting portions of the light sources is reduced in the light source unit.

In the light source unit described above, the locking edges may have a shape formed by a section of the opening edge recessed from inside to outside, and/or extended from outside to inside. Here, "and/or" means that the locking edges may include both the shape formed by a section of the opening edge recessed from inside to outside and the shape formed by a section of the opening edge extended from outside to inside, and that the locking edges may include only one of these shapes.

In the light source unit described above, the locking edges may include a section of the opening edge recessed from inside to outside in a protruding shape.

In the light source unit described above, the locking edges may include a section of the opening edge extended from outside to inside in a protruding shape.

In the light source unit described above, the locking edges may include a section of the opening edge recessed from inside to outside in a pointed shape, and a portion formed by a section of the opening edge extended from outside to inside in a pointed shape.

In the light source unit described above, the locking edges may include a section of the opening edge recessed from inside to outside in a semi-circular or semi-elliptic shape.

In the light source unit described above, the locking edges may include a section of the opening edge extended from outside to inside in a semi-circular or semi-elliptic shape.

In the light source unit described above, the locking edges may include a section of the opening edge extended from outside to inside in a wave-like shape.

In the light source unit described above, the locking edges may include a section of the opening edge recessed from inside to outside in a wave-like shape.

In the light source unit described above, the light sources each may be composed of an LED.

A lighting device according to the present invention includes the light source unit described above, and a light guide plate made of a plate-like member and including a light entering surface and a light exiting surface. The light entering surface is one of end surfaces of the plate-like member opposite the light sources of the light source unit through which light from the light sources enter. The light exiting surface is one of plate surfaces of the plate-like member through which the light entered through the light entering surface exit.

A display device according to the present invention includes the lighting device described above and a display panel that is configured to display images using light from the lighting device.

In the display device described above, the display panel may be a liquid crystal panel.

Advantageous Effect of the Invention

The present invention can provide a light source unit or the like that can reduce occurrence of conduction failures in mounting portions of the light sources.

BEST MODE FOR CARRYING OUT THE INVENTION

First Embodiment

A first embodiment of the present invention will be described with reference to FIG. 1 to FIG. 6. This embodiment will illustrate a liquid crystal display device (one example of display device) equipped with an edge light type lighting device.

Figure 1:
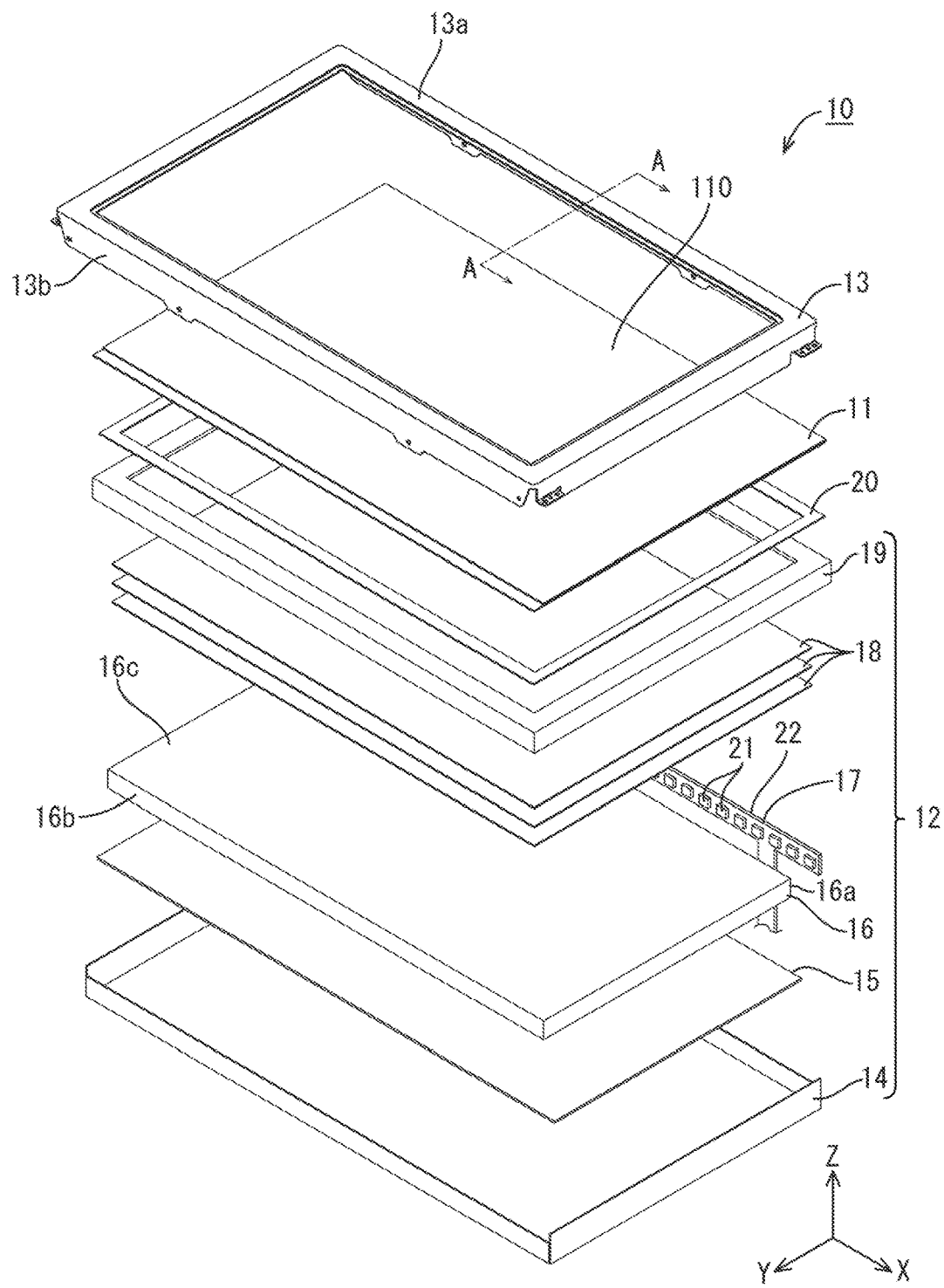
FIG. 1 is an illustrative exploded perspective view of a liquid crystal display device according to a first embodiment of the present invention.
Figure 2:
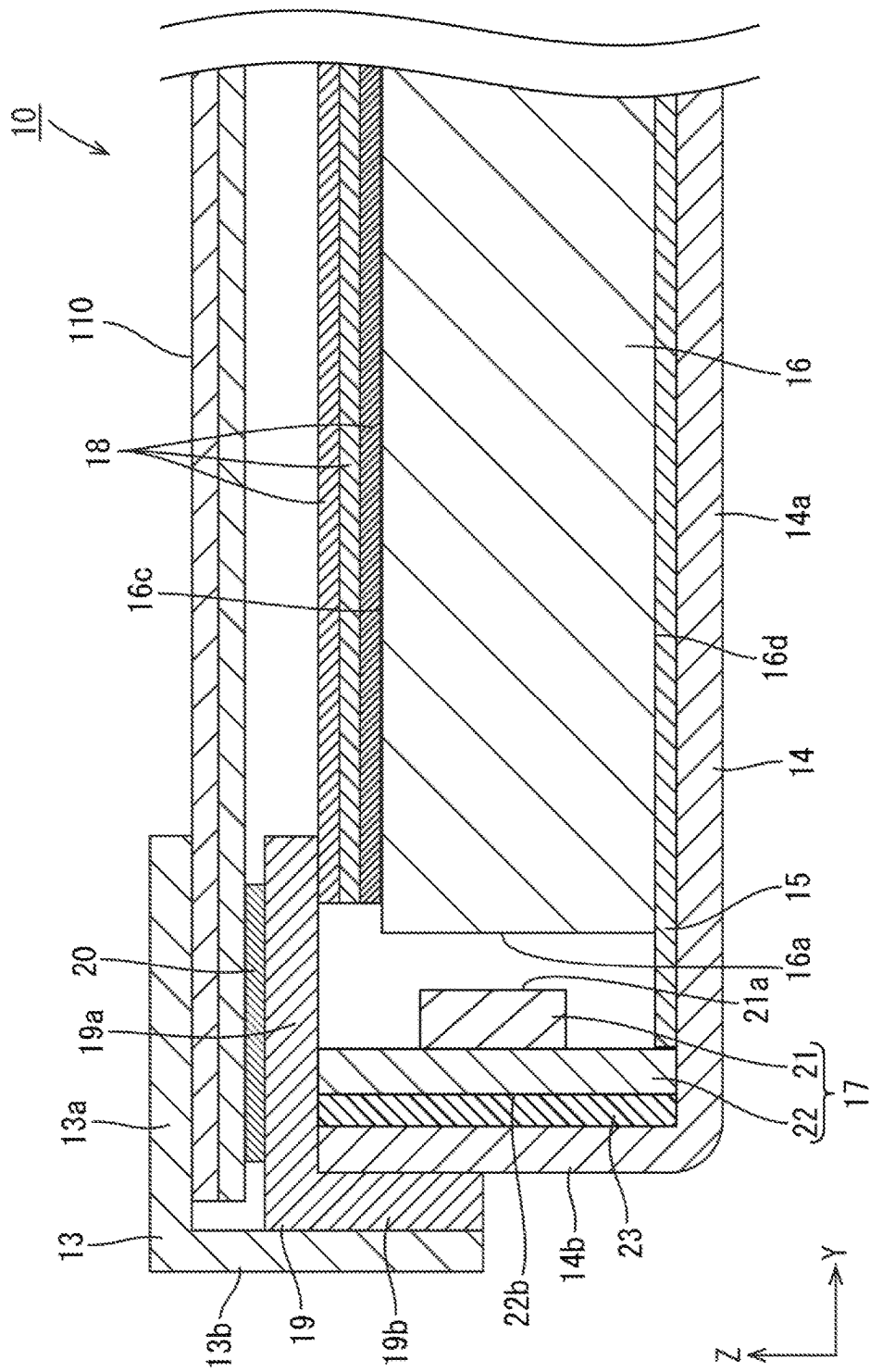
FIG. 2 is an A-A cross-sectional view of the liquid crystal display device of FIG. 1.

FIG. 1 is an illustrative exploded perspective view of a liquid crystal display device 10 according to a first embodiment of the present invention. FIG. 2 is an A-A cross-sectional view of the liquid crystal display device 10 of FIG. 1. The drawings each illustrate the X axis, Y axis, and Z axis. The upper side as shown in FIG. 1 and FIG. 2 is the front side (display surface side) of the liquid crystal display device 10, and the lower side is the back side (rear side) of the liquid crystal display device 10.

The liquid crystal display device 10 forms a portion of a car instrument panel, and displays various images such as images of indicators, map images of a car navigation system, pictures taken by an in-vehicle camera, and so on. This liquid crystal display device 10 has a horizontally long rectangular shape as a whole as shown in FIG. 1 and generally includes a liquid crystal panel 11 as the display panel, an edge light type lighting device (backlight device) 12 that supplies light to the liquid crystal panel 11, and a bezel 13. In each drawing, the longitudinal direction of the liquid crystal display device 10 corresponds to the X-axis direction, the short-side direction corresponds to the Y-axis direction, and the thickness direction corresponds to the Z-axis direction.

The liquid crystal panel 11 uses the light supplied from the lighting device 12 and displays images to be visible on a display surface 110 that is a front-side plate surface. The liquid crystal panel 11 has a horizontally long rectangular shape as a whole as shown in FIG. 1. In each drawing, the longitudinal direction of the liquid crystal display device 10 corresponds to the X-axis direction, the short-side direction corresponds to the Y-axis direction, and the thickness direction corresponds to the Z-axis direction.

The liquid crystal panel 11 generally includes a pair of highly transmissive glass substrates 11a and 11b, a liquid crystal layer (not shown) containing liquid crystal molecules and sandwiched between both substrates 11a and 11b, and a sealing member (not shown) surrounding the liquid crystal layer and interposed between the pair of substrates 11a and 11b in the outer peripheral edges to seal the liquid crystal layer.

Of the two substrates 11a and 11b forming the liquid crystal panel 11, the one on the front side is a color filter (hereinafter, CF) substrate 11a, and the one on the back side is an array substrate 11b. A polarizing plate (not shown) is bonded to the outer side of each of the substrates 11a and 11b.

The array substrate 11b is slightly larger than the CF substrate 11a, with the length in the short-side direction of the array substrate 11b larger than that of the CF substrate 11a. Therefore, when both substrates 11a and 11b are overlapped, one edge along the longitudinal direction of the array substrate 11b protrudes outward from the edge of the CF substrate 11a. A driver for driving the liquid crystal panel 11 and a flexible substrate are attached to this protruded end. The driver processes various input signals supplied from a panel drive circuit substrate via the flexible substrate and supplies the processed signals to TFTs that will be described later.

TFTs (Thin Film Transistors) that are switching elements and pixel electrodes are arranged in matrix on an inner side (liquid crystal layer side) of the array substrate 11b. Gate and source lines in a grid pattern are arranged to surround each of the TFTs and pixel electrodes. Signals related to images are supplied to the gate and source lines by the driver mentioned above. The pixel electrodes are made of a transparent conductive film of ITO (indium tin oxide), ZnO (zinc oxide) and the like.

Color filters are provided at positions corresponding to the pixels on the inner side (liquid crystal layer side) of the CF substrate 11a. Three color units of R (red), G (green), and B (blue) are aligned in the color filter. A light shielding layer (black matrix) is formed between adjacent color units of the color filter. Counter electrodes are provided on the surfaces of the color filters and light shielding layers to face the pixel electrodes on the array substrate 11b side. The counter electrodes are made of a transparent conductive film similarly to the pixel electrodes mentioned above. An orientation film is formed on each of the inner surfaces of both substrates 11a and 11b in order to orient the liquid crystal molecules contained in the liquid crystal layer.

The bezel 13 is in the shape of a rectangular frame extending along the outer peripheral edges of the liquid crystal panel 11 and made of a metal material such as aluminum. Lighting devices in other embodiments may not include the bezel 13. The bezel 13 includes a pressing portion 13a that presses all around a frame-like non-display region along the outer peripheral edges of the liquid crystal panel 11 from the front side, and peripheral walls 13b that extend downward from the outer peripheral edges of the pressing portion 13a and surround all around the lighting device 12. The bezel 13 holds the liquid crystal panel 11 in such a way as to sandwich the panel between itself and the lighting device 12. Double-sided adhesive tape 20 in the form of a frame in a plan view is interposed between the liquid crystal panel 11 and the lighting device 12 so that the liquid crystal panel 11 and the lighting device 12 are fixed to each other by the double-sided adhesive tape 22. The double-sided adhesive tape 20 has light shielding properties so that light leaking from the lighting device 12 is prevented from passing through outer peripheral ends (non-display region) of the liquid crystal panel 11.

The lighting device 12 projects light toward the back side of the liquid crystal panel 11 to make images visible on the display surface 110 of the liquid crystal panel 11. This lighting device 12 is of an edge light type and generally includes a chassis 14, a reflective sheet 15, a light guide plate 16, an LED unit (one example of light source unit) 17, an optical sheet 18, a frame 19, and so on.

The chassis 14 is substantially in the form of a shallow box open toward the front side (liquid crystal panel 11 side) and accommodates the LED unit 17, light guide plate 16, and others. The chassis 14 is made of a metal material such as aluminum, or resin material and the like. The chassis 14 includes a plate-like bottom portion 14a that has a similar shape as that of the liquid crystal panel 11 and others in a plan view, and plate-like peripheral walls 14b extending upright from outer peripheral edges of this bottom portion 14a toward the front side to surround the light guide plate 16 and others.

The bottom portion 14a is rectangular similarly to the liquid crystal panel 11 and others. The reflective sheet 15 having substantially the same shape as that of the liquid crystal panel 11 and others is laid on the front side of the bottom portion 14a. The reflective sheet 15 is made of a white plastic foam sheet (polyethylene terephthalate foam).

The peripheral walls 13b of the bezel 13 and peripheral walls 19b of the frame 19 are positioned outside the peripheral walls 14b. The peripheral walls 14b of the chassis 14, and the peripheral walls 13b of the bezel 13 and others, are fixed to each other by a fixing structure (not shown).

The LED unit 17 is a device that emits light toward an end face of the light guide plate 16, and includes a plurality of LEDs (one example of light source) 21, and an LED substrate (one example of light source substrate) 22 on which the LEDs 21 are mounted. The LED unit 17 is fixed to an inner wall surface of the peripheral wall 14b on one long side of the chassis 14 such that the LEDs 21 face the end face 16a of the long side of the light guide plate 16 with the use of an elongated (long) double-sided adhesive tape 23 (see FIG. 2). In other embodiments, the LED unit 17 may be fixed to an inner wall surface of the peripheral wall 14b on one short side of the chassis 14 such that the LEDs 21 face the end face of the short side of the light guide plate 16 with the use of a double-sided adhesive tape or the like. The LED unit 17 will be described later in more detail.

The light guide plate 16 is a plate-like member made of a transparent resin such as polycarbonate or the like and having a predetermined thickness. The plate has a horizontally long rectangular shape in a plan view similarly to the liquid crystal panel 11 and others. The light guide plate 16 is slightly smaller than the bottom portion 14a of the chassis 14, and placed on the bottom portion 14a, with the reflective sheet 15 interposed therebetween.

One end face 16a along the longitudinal direction (long side) of the light guide plate 16 faces the light emitting surfaces 21a of the LEDs 21 and constitutes a light entering surface (light receiving surface) 16a which light from the light emitting surfaces 21a enters. The other end face 16b along the longitudinal direction (long side) of the light guide plate 16 faces the inner wall surface of the peripheral wall 14b of the other long side of the chassis 14.

A front-side plate surface 16c of the light guide plate 16 is a light exiting surface 16c from which the light that has entered the light guide plate 16 from the light entering surface 16a is emitted toward the liquid crystal panel 11 side. The back-side plate surface 16d of the light guide plate 16 faces the reflective sheet 15 in close contact therewith inside the chassis 14. The back-side plate surface 16d of the light guide plate 16 is provided with multiple patterns to create texture (not shown) for light extraction.

Both end faces 16e and 16f along the short-side direction (short side) of the light guide plate 16 face the respective peripheral walls 14b along the short-side direction (short side) of the chassis 14.

The light emitted from the light emitting surfaces 21a of the LEDs 21 enters the light guide plate 16 from the light entering surface 16a. The light that has entered the light guide plate 16 propagates inside the light guide plate 16 as it is repeatedly reflected by the front and back sides of the light guide plate 16, and is somewhat spread two-dimensionally when it exits the light exiting surface 16c toward the liquid crystal panel 11. The reflective sheet 15 disposed on the back side of the light guide plate 16 has the function of reflecting the light coming out from the back-side plate surface 16d and orienting the reflected light back into the light guide plate 16 while directing it toward the light exiting surface 16c.

The optical sheet 18 has the same shape as that of the light guide plate 16 in a plan view, and is laid over the light guide plate 16 in such a way as to cover the light exiting surface 16c. The outer peripheral edges of the optical sheet 18 are interposed between a frame-like pressing portion 19a of the frame 19 and the outer peripheral edges of the light guide plate 16.

The optical sheet 18 has the function of transmitting the light exiting from the light exiting surface 16c toward the back side of the liquid crystal panel 11 and giving predetermined optical effects. The optical sheet 18 is made of a plurality of (three in this embodiment) sheet-like members stacked upon one another. The sheets forming the optical sheet 18 are selected as required from a group consisting of, for example, diffusive sheets, lens sheets, reflective polarizing sheets, and so on. As the light exiting from the light exiting surface 16*c* of the light guide plate 16 passes through the optical sheet 18, the light is spread two-dimensionally more evenly.

The frame 19 is in the form of a frame as a whole, and, as mentioned above, includes the frame-like pressing portion 19*a* and the peripheral walls 19*b* that extend downward from the outer peripheral edges of the pressing portion 19*a* and surround the peripheral walls 14*b* of the chassis 14. The frame 19 is made of metal or synthetic resin, and fitted over the peripheral walls 19*b* of the chassis 14 from the distal end side (front side). The frame-like double-sided adhesive tape 20 mentioned above is bonded to the upper face of the frame 19, and the liquid crystal panel 11 is bonded thereon.

Figure 3:
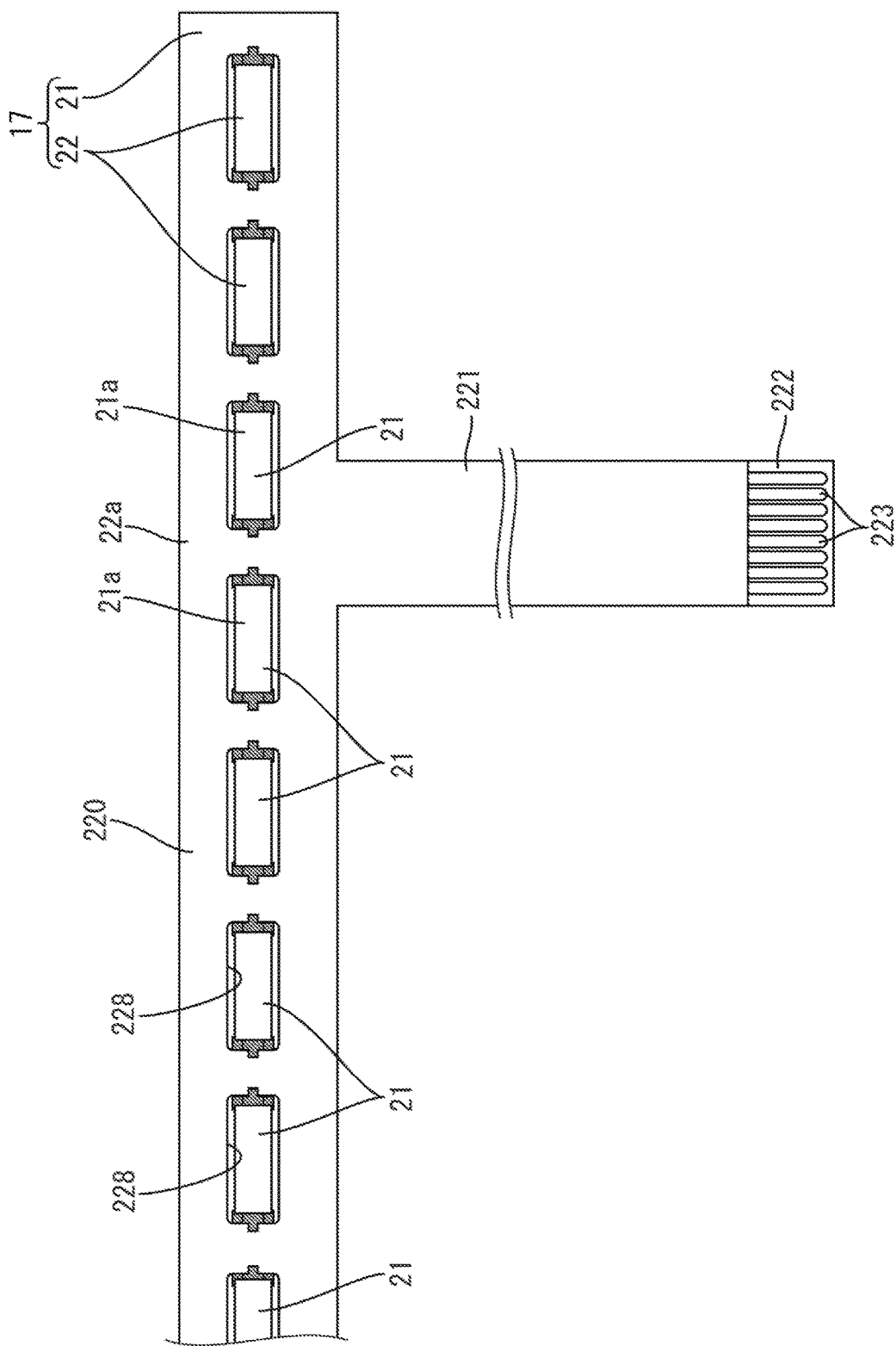
FIG. 3 is a partial front view of an LED unit.

Next, the LED unit 17 will be described in detail. FIG. 3 is a partial front view of the LED unit 17. The LED unit 17 is elongated as a whole and includes, as described above, a plurality of LEDs 21, and a flexible LED substrate 22 on which the LEDs 21 are mounted.

Figure 4:
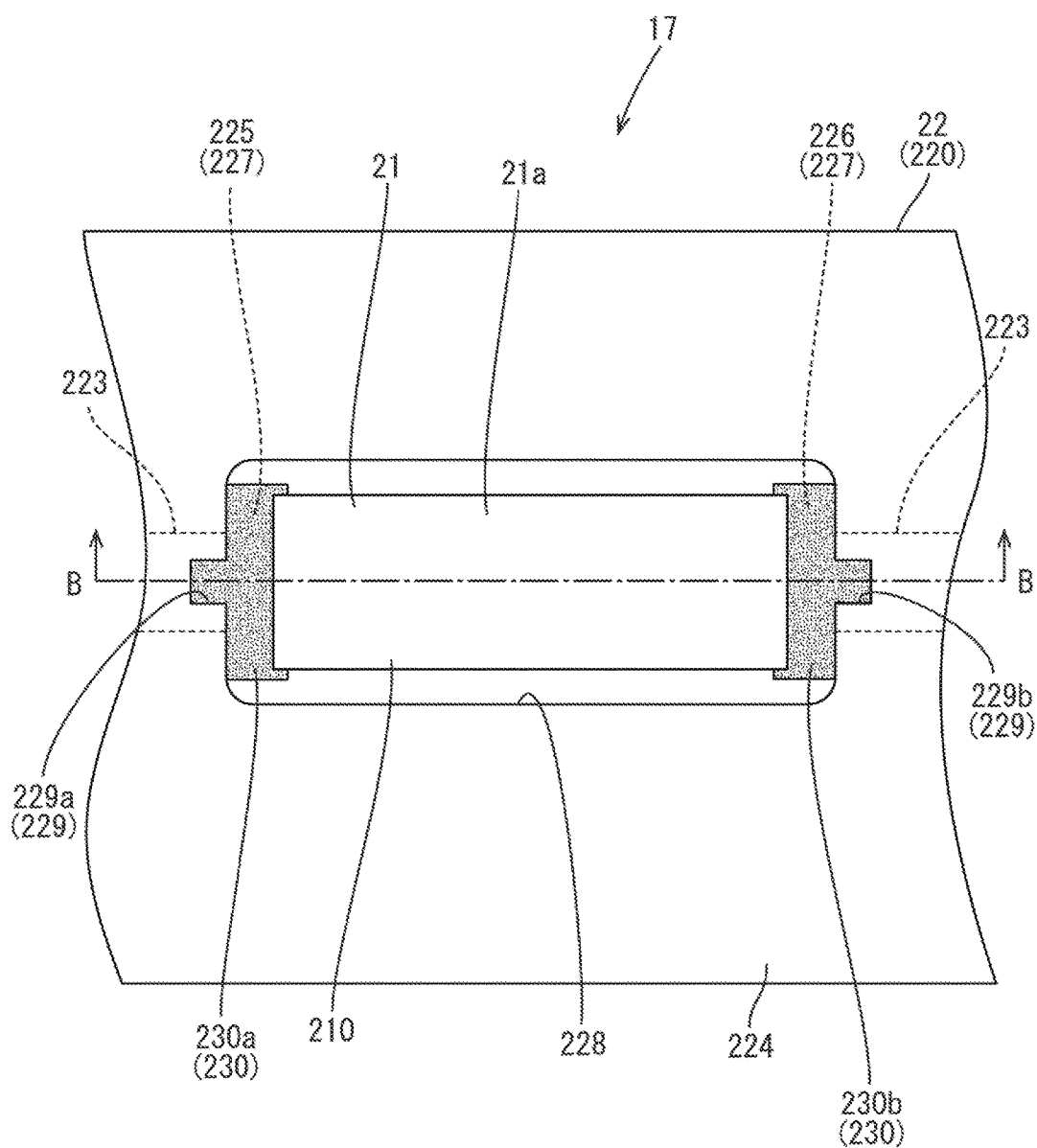
FIG. 4 is an enlarged view of an LED mounted on an LED substrate.
Figure 5:
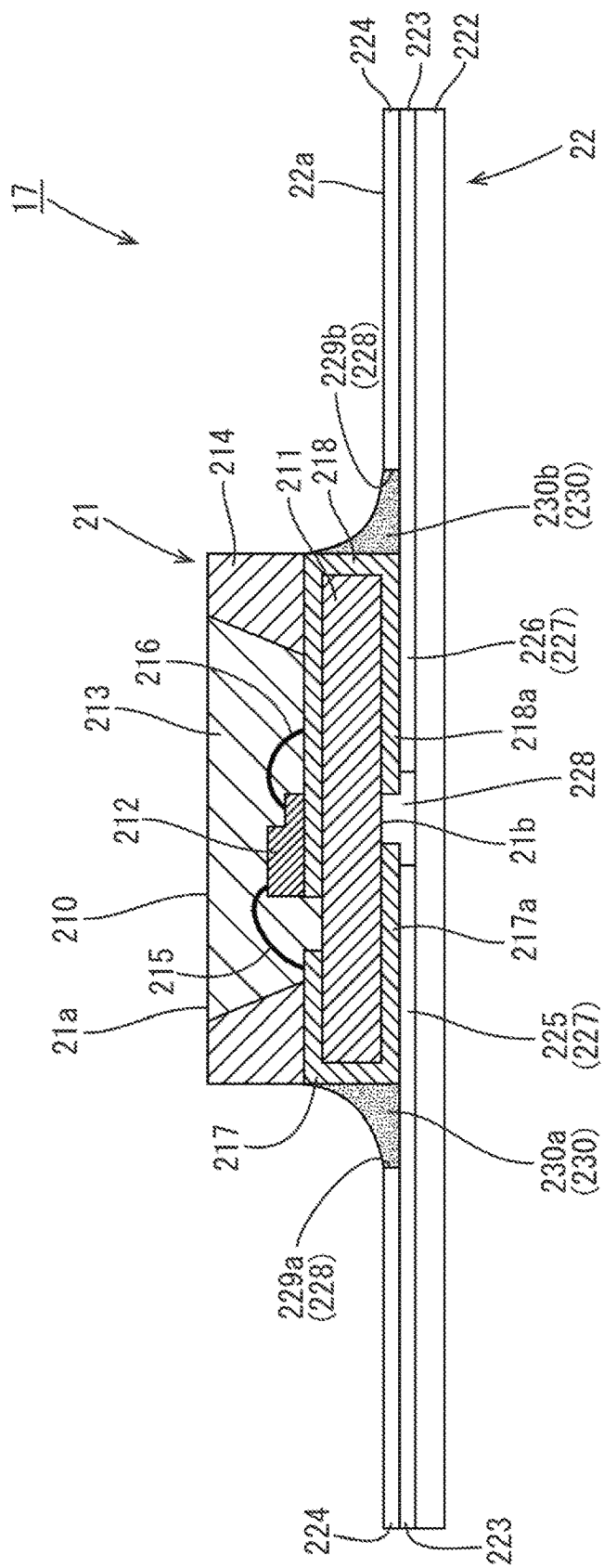
FIG. 5 is a cross-sectional view along B-B of FIG. 4.

FIG. 4 is an enlarged view of an LED 21 mounted on the LED substrate 22, and FIG. 5 is a cross-sectional view along B-B of FIG. 4. The LED 21 is the one known as top emission type and has a rectangular parallelepiped outer shape. The LED 21 is mounted on the front-side plate surface (front surface) 22*a* of the LED substrate 22 by soldering as will be described later. The top face 21*a* of the LED 21 forms the light emitting surface 21*a* from which light is emitted toward the light entering surface 16*a* of the light guide plate 16.

As shown in FIG. 5, the LED 21 generally includes a substrate portion 211 fixedly attached to the LED substrate 22, an LED chip 212 set on the substrate portion 211, a resin sealed portion 213 that encapsulates the LED chip 212, a reflector 214 that surrounds the sealed portion 213 on the substrate portion 211, and a pair of anode terminal 217 and a cathode terminal 218 electrically connected to the LED chip 212 via bonding wires 215 and 216.

The LED chip 212 used here is the one that emits a single color, blue light, for example. The sealed portion 213 used here is the one that contains a fluorescent substance dispersed therein that emits light of a predetermined color when excited by the light (e.g., blue light) emitted from the LED chip 212. White light produced by these lights mixed together is emitted from the light emitting surface 21*a* of the LED 21.

The anode terminal 217 is connected to an anode electrode of the LED chip 212 via the bonding wire 215. The cathode terminal 218 is connected to a cathode electrode of the LED chip 212 via the bonding wire 216. The anode terminal 217 and cathode terminal 218 are both made from a thin strip of (elongated) metal sheet formed into a predetermined shape.

The anode terminal 217 and cathode terminal 218 are disposed separately at both ends in the longitudinal direction of the LED 21 as shown in FIG. 5, and each bent from the front side over to the back side of the substrate portion 211. Therefore, the respective distal ends 217*a* and 218*b* of the anode terminal 217 and cathode terminal 218 are positioned on the back side 21*b* of the substrate portion 211 (opposite side from the light emitting surface 21*a*).

The LED 21 includes a rectangular parallelepiped package body 210 formed by the substrate portion 211, LED chip 212, sealed portion 213, reflector 214, and so on. The anode terminal 217 and cathode terminal 218 are disposed from both ends in the longitudinal direction of this package body 210 over to the back side.

The LEDs 21 are mounted on the front surface 22*a* of the LED substrate 22 along the longitudinal direction of the LED substrate 22 such that they are spaced apart (at equal intervals in this embodiment) and aligned in a row (in a single file in this embodiment). As will be described later, the LEDs 21 are each mounted on respective mounting portions provided on the front surface 22*a* of the LED substrate 22.

The LED substrate 22 is the one known as flexible printed substrate (FPC) and has flexibility. The LED substrate 22 of this embodiment includes a long (elongated) substrate main body 220 on which the plurality of LEDs 21 are mounted, and a strip-like extended-out portion 221 extended from the substrate main body 220 in a direction orthogonal to the substrate main body 220.

The LED substrate 22 includes a support layer 222, a wiring portion 223, a cover layer 224, and so on. The support layer (base film) 222 is made of a flexible and insulating synthetic resin (e.g., polyimide resin) film. The wiring portion 223 is made from a conductive film such as metal foil (e.g., copper foil) patterned with a predetermined line width, and fixed on the support layer 222 with the use of an adhesive (not shown) or the like in such a way as to connect the plurality of LEDs 21 in series. The wiring portion 223 is formed mostly on the substrate main body 220, but also partly on the extended-out portion 221. At one end of the portion of the wiring portion 223 provided on the extended-out portion 221, a terminal portion 223*a* is formed on the support layer 222 of the extended-out portion 221, to be mounted to a power supply connector of an LED drive circuit substrate (not shown).

Figure 6:
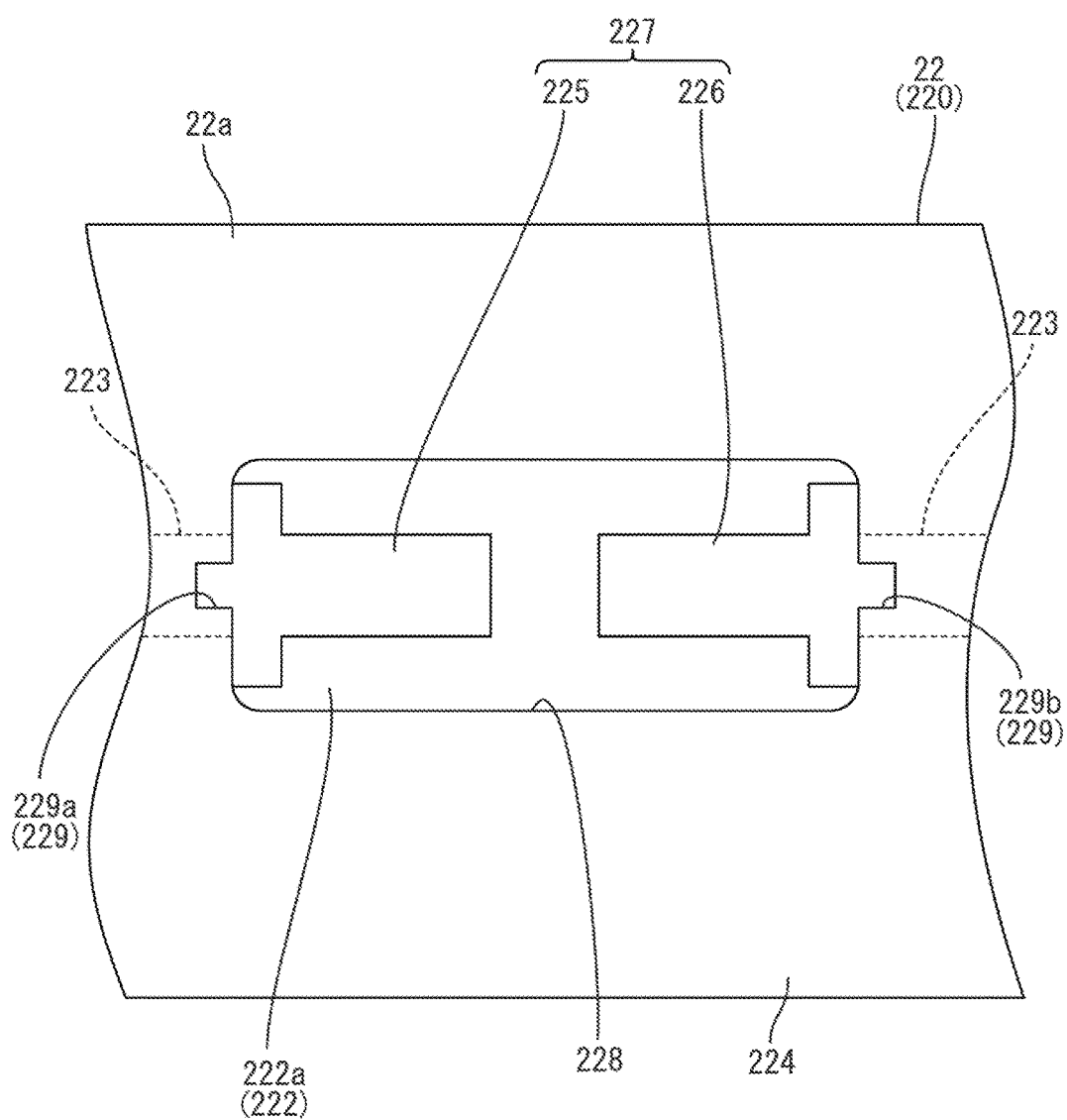
FIG. 6 is an enlarged view of a mounting portion having a pair of lands formed on the LED substrate.

Midway in the wiring portion 223 are provided a pair of lands 225 and 226 connected to the pair of terminals (anode terminal 217 and cathode terminal 218) of the LED 21. FIG. 6 is an enlarged view of a mounting portion 227 including the pair of lands 225 and 226 formed on the LED substrate 22. The pair of lands 225 and 226 include the anode-side land 225 connected to the anode terminal 217 of the LED 21, and the cathode-side land 226 connected to the cathode terminal 218.

The lands 225 and 226 are each made of a conductive film such as metal foil (e.g., copper foil) similarly to the wiring portion 223 and connected to the wiring portion 223. The pair of lands 225 and 226 are separated and opposite from each other on the support layer 222 as shown in FIG. 6. One land 225 is the portion to be in contact with the distal end 217*a* of the anode terminal 217, while the other land 226 is the portion to be in contact with the distal end 218*a* of the cathode terminal 218, when the LED 21 is mounted.

Mounting portions 227 are portions of the LED substrate 22 where the LEDs 21 are mounted. The mounting portions are provided on the front surface 22*a* of the LED substrate 22. Each mounting portion 227 includes the pair of lands 225 and 226, and is each assigned to each of the LEDs 21.

The cover layer (cover film) 224 is made of a flexible and insulating synthetic resin (e.g., polyimide resin) film. The cover layer 224 is formed on the support layer 222 in such a way as to cover the wiring portion 223. The cover layer 224 is formed on the support layer 222 via an adhesive (not shown) or the like.

The cover layer 224 is provided with a plurality of opening edges 228 through which the mounting portions 227 are exposed. As shown in FIG. 6, the opening edges 228 as a whole define a horizontally long rectangular shape that surrounds the rectangular parallelepiped LED 21 (package body 210) in a plan view. The mounting portions 227 such as the pair of lands 225 and 226 are exposed inside the opening edges 228. The portion 222*a* that is a portion of the support layer 222 and supports the lands 225 and 226 is exposed inside the opening edges 228.

In this embodiment, the opening edges 228 form a rectangular shape that is elongated in the longitudinal direction of the LED substrate 22 (in the direction of alignment of the LEDs 21) as shown in FIG. 6. Two portions along the short-side direction of the opening edges 228 configure locking edges 229, 229 that respectively overlap the lands 225 and 226 non-linearly in a plan view. The one that overlaps the anode-side land 225 may be referred to as locking edge 229*a*, and the one that overlaps the cathode-side land 226 may be referred to as locking edge 229*b*.

The locking edges 229*a* and 229*b* each include one each portion formed by a section of the opening edge 228 recessed from inside to outside in a protruding shape for each of the lands 225 and 226. Therefore, as shown in FIG. 6, each of the lands 225 and 226 exposed inside the opening edges 228 includes a portion extended from inside to outside in a protruding shape, because of the locking edges 229*a* and 229*b* partly overlapping in a non-linear manner (in this embodiment, protruding shape).

The LED substrate 22 also includes solder portions 230, 230. The solder portions 230, 230 are formed as a result of soldering the pair of lands 225 and 226 with the pair of terminals 217 and 218 of the LED 21, respectively, and electrically connect the lands 225 and 226 with the terminals 217 and 218. Known materials, such as lead-free solder materials and the like, are used for the solder portions 230. The one that is used for the anode side may be referred to as solder portion 230*a*, and the one that is used for the cathode side may be referred to as solder portion 230*b*.

The solder portions 230, 230 are provided on both sides of the LED 21 inside the opening edges 228 as shown in FIG. 4 and FIG. 5. The anode-side solder portion 230*a* conforms and adheres to the anode-side locking edge 229*a*. Therefore, a section of the solder portion 230*a* is extended from inside to outside of the opening edge 228 in a protruding shape. The cathode-side solder portion 230*b* conforms and adheres to the cathode-side locking edge 229*b*. Therefore, a section of the solder portion 230*b* is also extended from inside to outside of the opening edge 228 in a protruding shape.

Generally, as shown in FIG. 5, the solder portions 230, 230 extend along the sides of the LED 21, and also somewhat upright from the LED substrate 22. In a plan view, as shown in FIG. 4, the solder portions 230, 230 are longer than the short sides of the LED 21, with both ends of the solder portions 230, 230 extending out from the LED 21.

The LED unit 17 configured as described above is fixed to the inner wall surface of the peripheral wall 14*b* on the long side of the chassis 14 by means of the double-sided adhesive tape 23 bonded to the back side 22*b* of the LED substrate 22 such that the light emitting surfaces 21*a* of the LEDs 21 face the light entering surface 16*a* of the light guide plate 16. The LED unit 17 is thin so that it can be accommodated in the confined space between the light guide plate 16 and the peripheral wall 14*b* inside the chassis 14.

For displaying images on the display surface 110 of the liquid crystal panel 11 of the liquid crystal display device 10 described above, each of the LEDs 21 in the LED unit 17 equipped in the lighting device 12 emits light (is turned on). When each LED 21 emits light, the light from the LED 21 enters the light guide plate 16 from the light entering surface 16*a* of the light guide plate 16. The light that has entered the light guide plate 16 propagates through the light guide plate 16 as it is reflected by the reflective sheet 15 laid on the back side of the light guide plate 16 and the light extraction pattern (not shown) provided on the back surface 16*d* of the light guide plate 16, and exits from the light exiting surface 16*c*. The light that has come out from the light exiting surface 16*c* spreads two-dimensionally as it passes through the optical sheet 18 and is provided to the back side of the liquid crystal panel 11. An image is then displayed visibly on the display surface 11 of the liquid crystal panel 11.

When attaching the LED unit 17 to the peripheral wall 14*b* of the chassis 14, the LED unit 17 must be handled carefully since the LED substrate 22 bends easily. Moreover, the liquid crystal display device 10 of this embodiment is for in-vehicle applications, so that the LED unit 17 equipped in the liquid crystal display device 10 (lighting device 12) is likely to be subjected to external forces such as vibration.

One conventional problem with this type of LED unit has been that when the LED substrate is bent, the stress tends to concentrate on the mounting portions of the LEDs near the bent portion. This is because the solder portions are not flexible unlike the support layer and cover layer of the LED substrate and therefore the joints where the solder portions adhere to the cover layer (where the solder portions adhere to the opening edges) are discontinuous.

In the LED unit 17 of this embodiment, however, the solder portion 230 adheres to the opening edge 228 non-linearly in a plan view so that the solder portion 230 and the locking edge 229 of the opening edge 228 are intertwined and interlocked with each other. As compared to conventional linear joints, the non-linear locking edge 229 of the opening edge 228 makes close contact with the solder 230 in a larger area. Because of this, the stress is dispersed in the adhered joint between the solder portion 230 and the locking edge 229, and they are more firmly attached to each other. As a result, stress hardly concentrates on the adhered joint between the solder portion 230 and the locking edge 229 so that the solder portion 230 and the locking edge 229 are hard to separate from each other. Removal or lifting up of the solder portion 230 from each of the lands 225 and 226 of the LED substrate is prevented, and connection between the terminals 217 and 218 of the LEDs 21 and the lands 225 and 226 is ensured, so that conduction failures are prevented.

Second Embodiment

Next, a second embodiment of the present invention will be described with reference to FIG. 7 and FIG. 8. This embodiment will describe an LED unit 17A having differently shaped locking edges 229A (opening edges 228A), and differently shaped lands 225A and 226A exposed in the opening edges 228A. The basic configuration of the LED unit 17A of this embodiment is similar to that of the first embodiment. Therefore, the elements that are identical to those of the first embodiment are given the same reference numerals as the first embodiment, and will not be described in detail (the same applies to description of other embodiments that follow).

Figure 7:
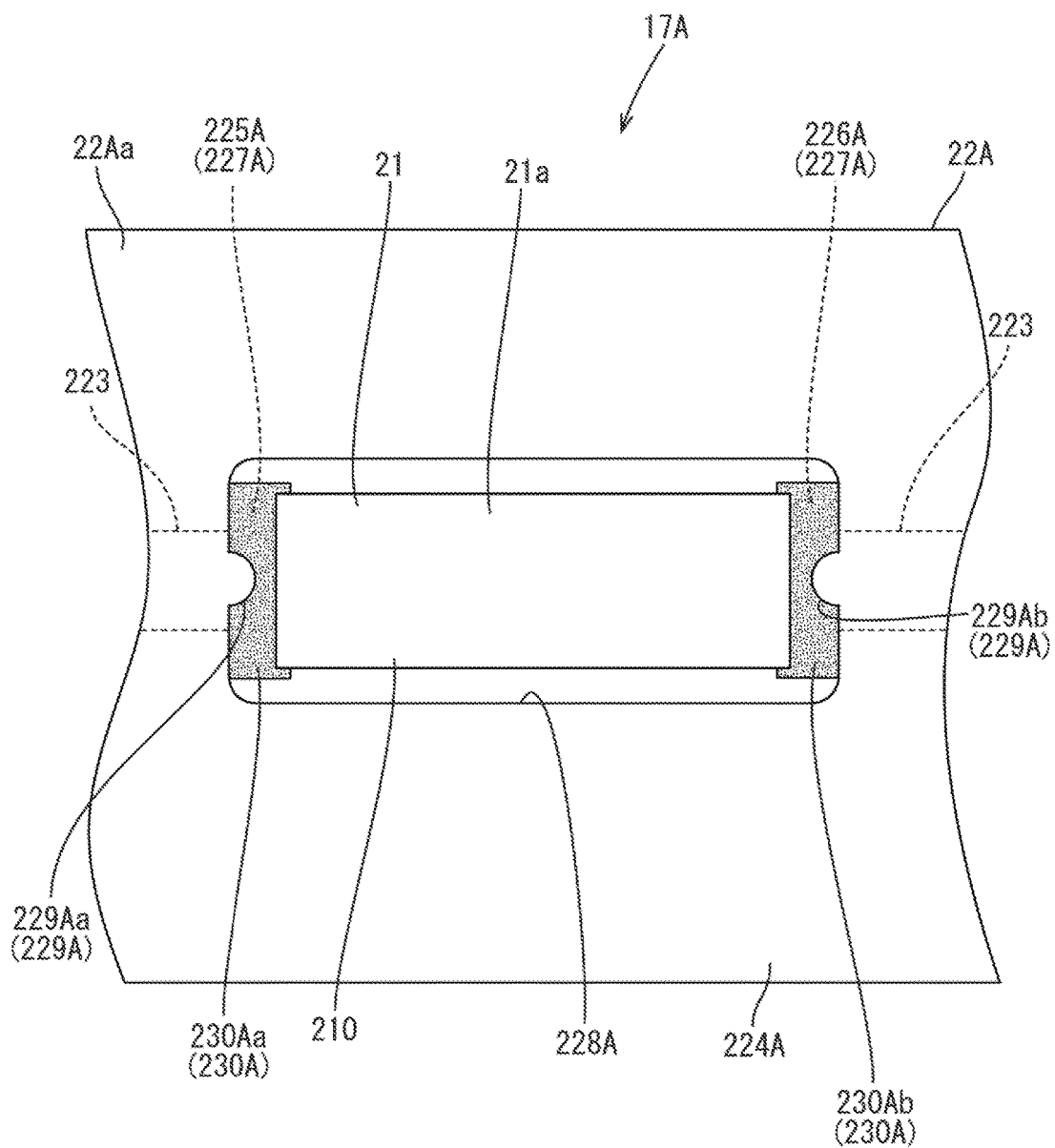
FIG. 7 is an enlarged view of an LED mounted on an LED substrate of an LED unit according to a second embodiment.
Figure 8:
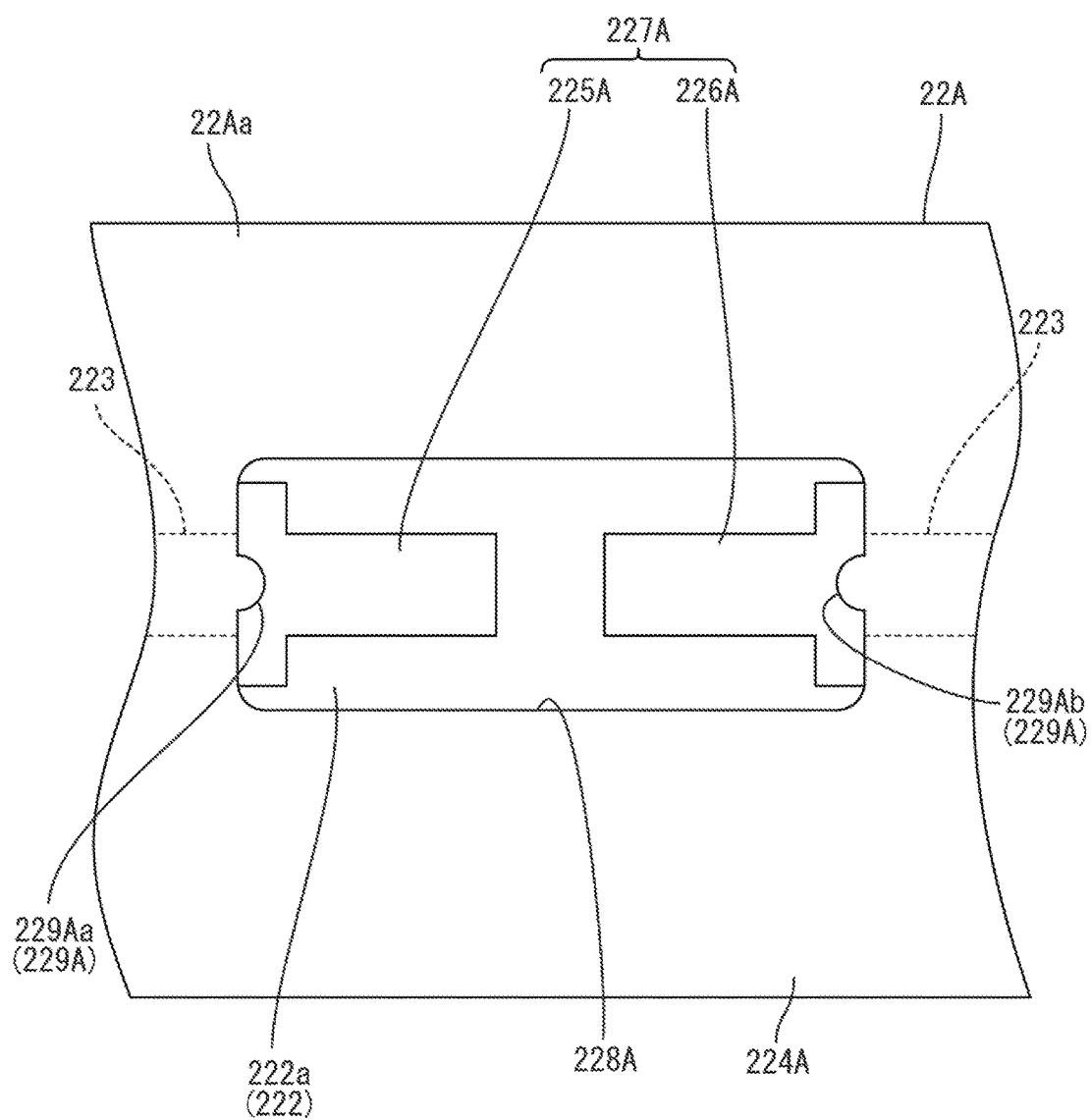
FIG. 8 is an enlarged view of a mounting portion having a pair of lands formed on the LED substrate according to the second embodiment.

FIG. 7 is an enlarged view of an LED 21 mounted on an LED substrate 22A of the LED unit 17A according to the second embodiment. FIG. 8 is an enlarged view of the mounting portion 227A having a pair of lands 225A and 226A formed on the LED substrate 22A according to the second embodiment.

As shown in FIG. 7, the LED 21 is mounted on the mounting portion 227A provided on the front surface 22Aa of the LED substrate 22A. The mounting portion 227A includes a pair of lands 225A and 226B. Before the LED 21 is mounted, the lands 225A and 226A supported on a support layer 222 (222a) are exposed inside the opening edges 228A provided in a cover layer 224A, as shown in FIG. 8.

The opening edges 228A as a whole form a horizontally long rectangular shape similarly to that of the first embodiment. Two portions along the short-side direction of the opening edges 228A configure locking edges 229A, 229A that overlap each of the lands 225A and 226A non-linearly in a plan view. The one that overlaps the anode-side land 225A may be referred to as locking edge 229Aa, and the one that overlaps the cathode-side land 226A may be referred to as locking edge 229Ab.

The locking edges 229Aa and 229Ab of this embodiment each include one each portion formed by a section of the opening edge 228A extended from outside to inside in a semi-circular shape for each of the lands 225A and 226B. Therefore, as shown in FIG. 8, each of the lands 225A and 226A exposed inside the opening edges 228A includes a portion recessed from outside to inside in a semi-circular shape, because of the locking edges 229Aa and 229Ab partly overlapping in a non-linear manner (in this embodiment, in a semi-circular shape).

The pair of lands 225A and 226A and the pair of terminals of the LED 21 (see the first embodiment) are electrically connected to each other by soldering via the solder portions 230A, 230A. The one that is used for the anode side may be referred to as solder portion 230Aa, and the one that is used for the cathode side may be referred to as solder portion 230Ab.

The solder portions 230A, 230A are provided on both sides of the LED 21 inside the opening edges 228A as shown in FIG. 7. The anode-side solder portion 230Aa conforms and adheres to the anode-side locking edge 229Aa. Therefore, a section of the solder portion 230Aa is recessed from outside to inside of the opening edge 228A in a semi-circular shape. The cathode-side solder portion 230Ab conforms and adheres to the cathode-side locking edge 229Ab. Therefore, a section of the solder portion 230Ab is also recessed from outside to inside of the opening edge 228A in a semi-circular shape.

Similarly to the first embodiment described above, the solder portions 230A, 230A mounted on the mounting portion 227A extend along the sides of the LED 21, and also somewhat upright from the LED substrate 22A. In a plan view, the solder portions 230A, 230A are longer than the short sides of the LED 21, with both ends of the solder portions 230A, 230A extending out from the LED 21.

In the LED unit 17A of this embodiment, in this way, the solder portion 230A and the opening edge 228A make close contact with each other non-linearly in a plan view so that the solder portion 230A and the locking edge 229A of the opening edge 228A are intertwined and interlocked with each other. Therefore, similarly to the first embodiment described above, stress hardly concentrates on the adhered joint between the solder portion 230A and the locking edge 229A so that the solder portion 230A and the locking edge 229A are hard to separate from each other.

As demonstrated in this embodiment, locking edges 229A that include a portion extended from outside to inside in a semi-circular shape may be used.

Third Embodiment

Next, a third embodiment of the present invention will be described with reference to FIG. 9 and FIG. 10. This embodiment will describe an LED unit 17B having differently shaped locking edges 229B (opening edges 228B), and differently shaped lands 225B and 226B exposed inside the opening edges 228B.

Figure 9:
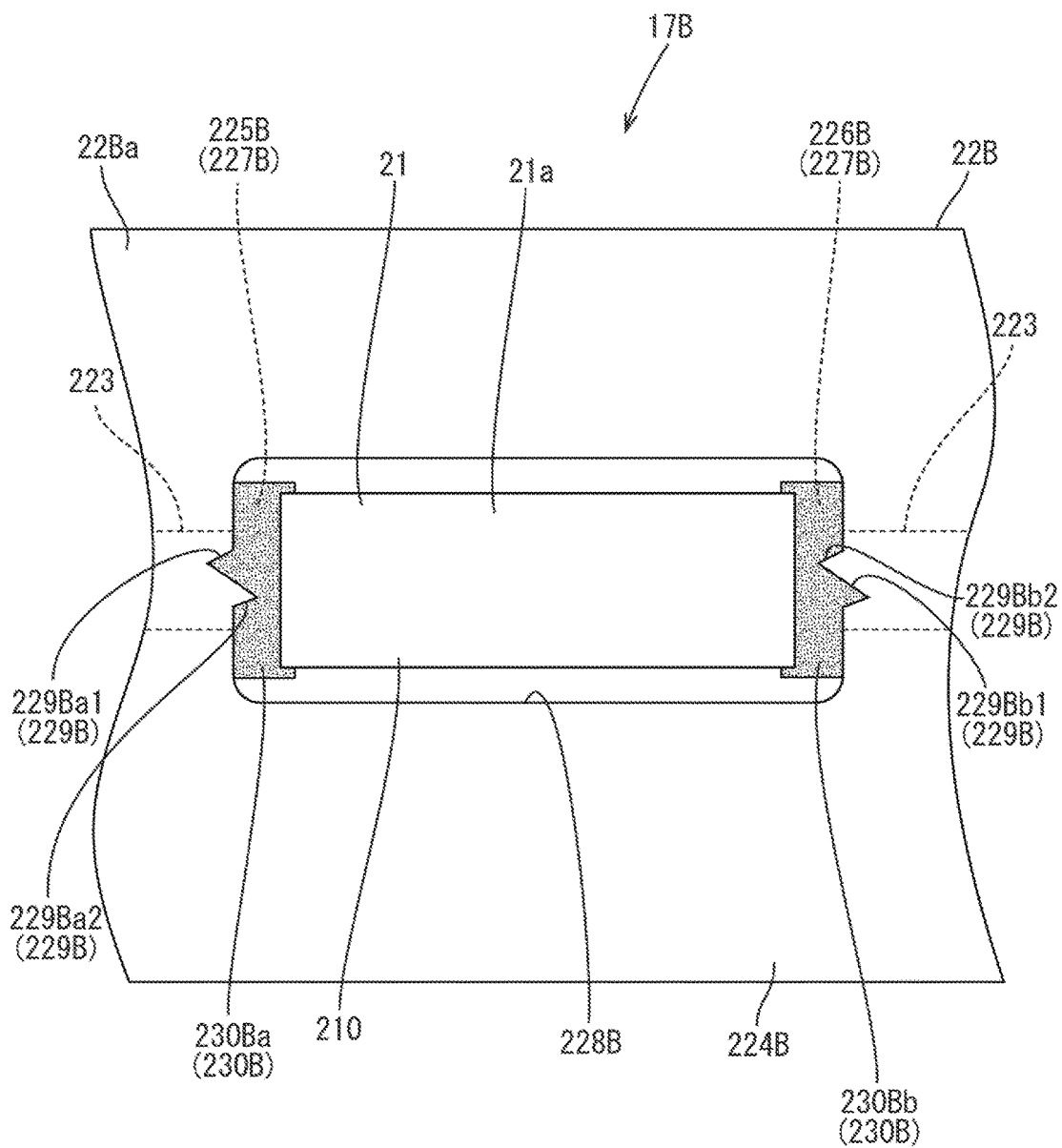
FIG. 9 is an enlarged view of an LED mounted on an LED substrate of an LED unit according to a third embodiment.

FIG. 9 is an enlarged view of an LED 21 mounted on an LED substrate 22B of the LED unit 17B according to the third embodiment. FIG. 10 is an enlarged view of the mounting portion 227B having a pair of lands 225B and 226B formed on the LED substrate 22B according to the third embodiment.

As shown in FIG. 9, the LED 21 is mounted on the mounting portion 227B provided on a front surface 22Ba of the LED substrate 22B. The mounting portion 227B includes a pair of lands 225B and 226B. Before the LED 21 is mounted, the lands 225B and 226B supported on the support layer 222 (222a) are exposed inside the opening edges 228B provided in the cover layer 224B, as shown in FIG. 10.

The opening edges 228B as a whole form a horizontally long rectangular shape similarly to that of the first embodiment. Two portions along the short-side direction of the opening edges 228B configure locking edges 229B, 229B that overlap each of the lands 225B and 226B non-linearly in a plan view. The one that overlaps the anode-side land 225B may be referred to as locking edge 229Ba1 and 229Ba2, and the one that overlaps the cathode-side land 226B may be referred to as locking edge 229Bb1 and 229Bb2.

The locking edges 229B of this embodiment each include one each of a portion (locking edge) 229Ba1 and 229Bb1 where the opening edge 228B is recessed from inside to outside in a sharply pointed shape (one example of pointed shape), and a portion (locking edge) 229Ba2 and 229Bb2 where the opening edge 228B is extended from outside to inside in a sharply pointed shape (one example of pointed shape), for each of the lands 225B and 226B.

Figure 10:
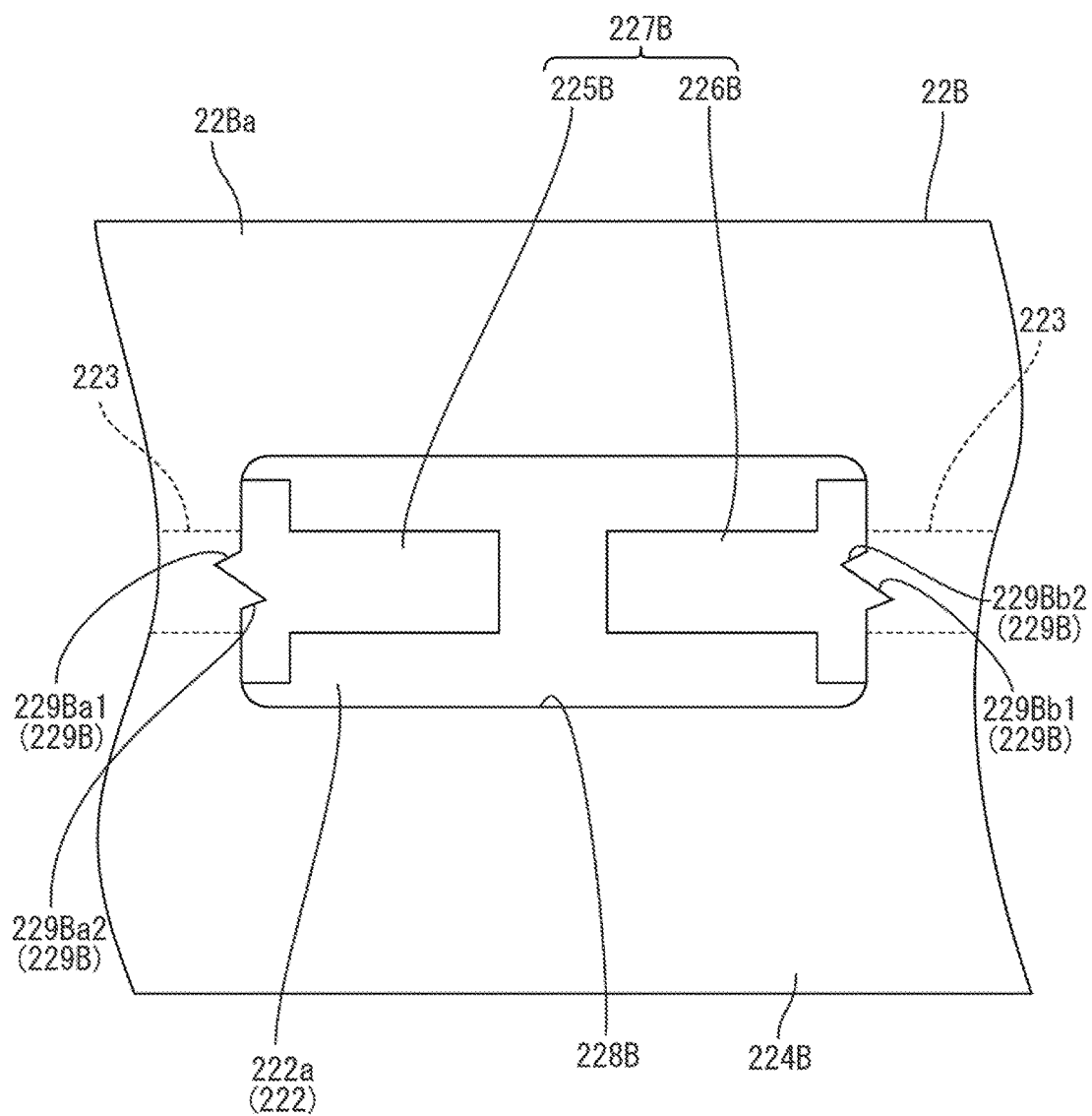
FIG. 10 is an enlarged view of a mounting portion having a pair of lands formed on the LED substrate according to the third embodiment.

Therefore, as shown in FIG. 10, each of the lands 225B and 226B exposed inside the opening edges 228B includes a portion recessed from outside to inside in a sharply pointed shape, and a portion extended from inside to outside in a sharply pointed shape, because of the locking edges 229B, 229B partly overlapping in a non-linear manner (in this embodiment, zigzag manner with the sharply pointed protrusion and recess).

The pair of lands 225B and 226B and the pair of terminals of the LED 21 (see the first embodiment) are electrically connected to each other by soldering via the solder portions 230B, 230B. The one that is used for the anode side may be referred to as solder portion 230Ba, and the one that is used for the cathode side may be referred to as solder portion 230Bb.

The solder portions 230B, 230B are provided on both sides of the LED 21 inside the opening edges 228B as shown in FIG. 9. The anode-side solder portion 230Ba conforms and adheres to the anode-side locking edges 229Ba1 and 229Ba2. Part of the solder 230Ba therefore is recessed from outside to inside of the opening edge 228B in a sharply pointed (pointed) shape, and extended from inside to outside of the opening edge 228B in a sharply pointed (pointed) shape.

The cathode-side solder portion 230Bb conforms and adheres to the cathode-side locking edges 229Bb1 and 229Bb2. Therefore, a section of the solder 230Bb is also recessed from outside to inside of the opening edge 228B in a sharply pointed (pointed) shape, and extended from inside to outside of the opening edge 228B in a sharply pointed (pointed) shape. The sharply pointed recess and sharply pointed protrusion of each of the locking edges 229B, 229B are adjacent to each other.

Similarly to the first embodiment described above, the solder portions 230B, 230B mounted on the mounting portion 227B extend along the sides of the LED 21, and also somewhat upright from the LED substrate 22B. In a plan view, the solder portions 230B, 230B are longer than the short sides of the LED 21, with both ends of the solder portions 230B extending out from the LED 21.

In the LED unit 17B of this embodiment, in this way, the solder portion 230B and the opening edge 228B make close contact with each other non-linearly in a plan view so that the solder portion 230B and the locking edge 229B of the opening edge 228B are intertwined and interlocked with each other. Therefore, similarly to the first embodiment described above, stress hardly concentrates on the adhered joint between the solder portion 230B and the locking edge 229B so that the solder portion 230B and the locking edge 229B are hard to separate from each other.

As demonstrated in this embodiment, locking edges 229B that include one each of a portion (locking edge) 229Ba1 and 229Bb1 where the opening edge 228B is recessed from inside to outside in a sharply pointed shape (one example of pointed shape), and a portion (locking edge) 229Ba2 and 229Bb2 where the opening edge 228B is extended from outside to inside in a sharply pointed shape (one example of pointed shape) may be used.

Forth Embodiment

Next, a fourth embodiment of the present invention will be described with reference to FIG. 11 and FIG. 12. This embodiment will describe an LED unit 17C having differently shaped locking edges 229C (opening edges 228C), and differently shaped lands 225C and 226C exposed inside the opening edges 228C.

Figure 11:
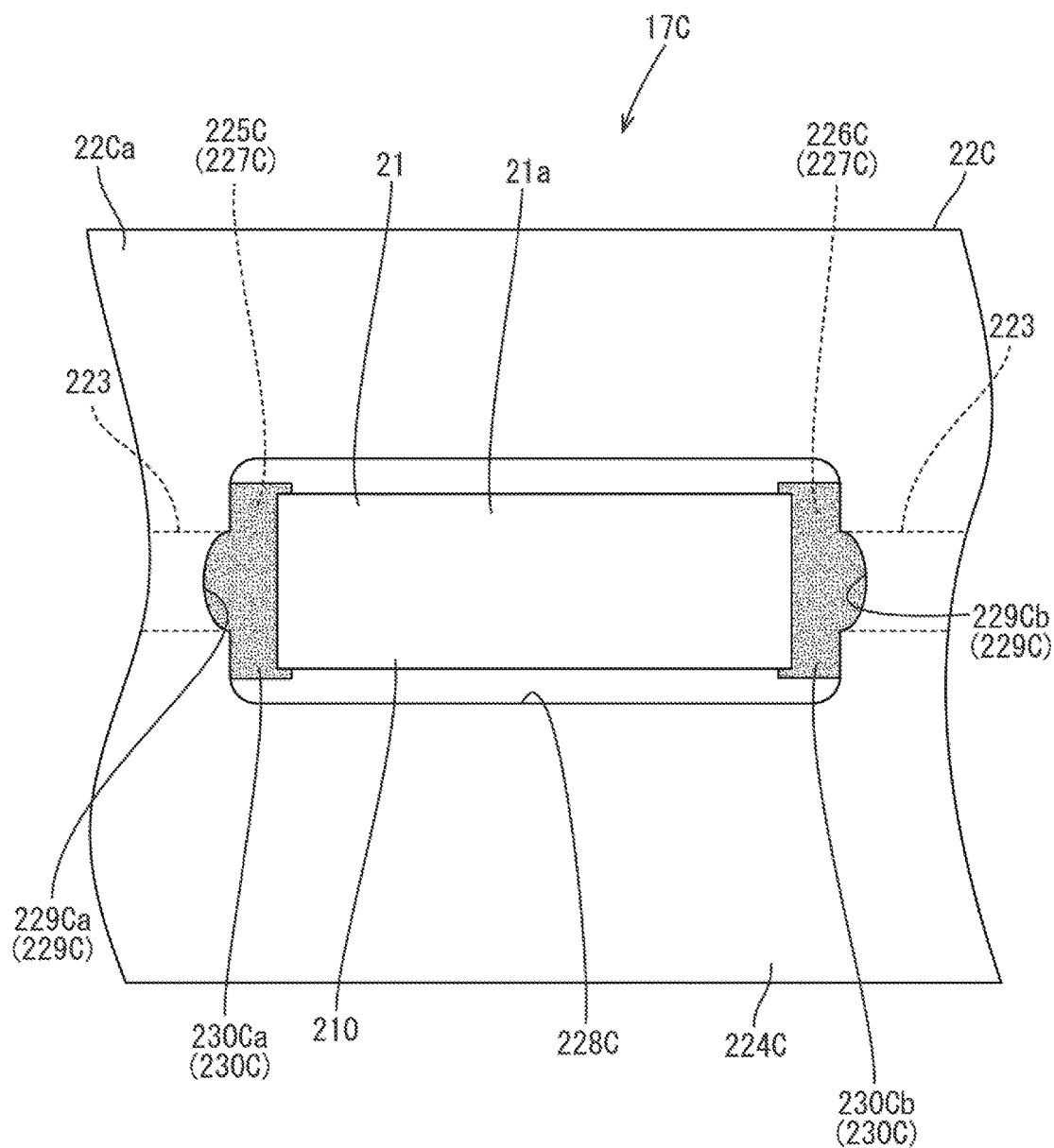
FIG. 11 is an enlarged view of an LED mounted on an LED substrate of an LED unit according to a fourth embodiment.
Figure 12:
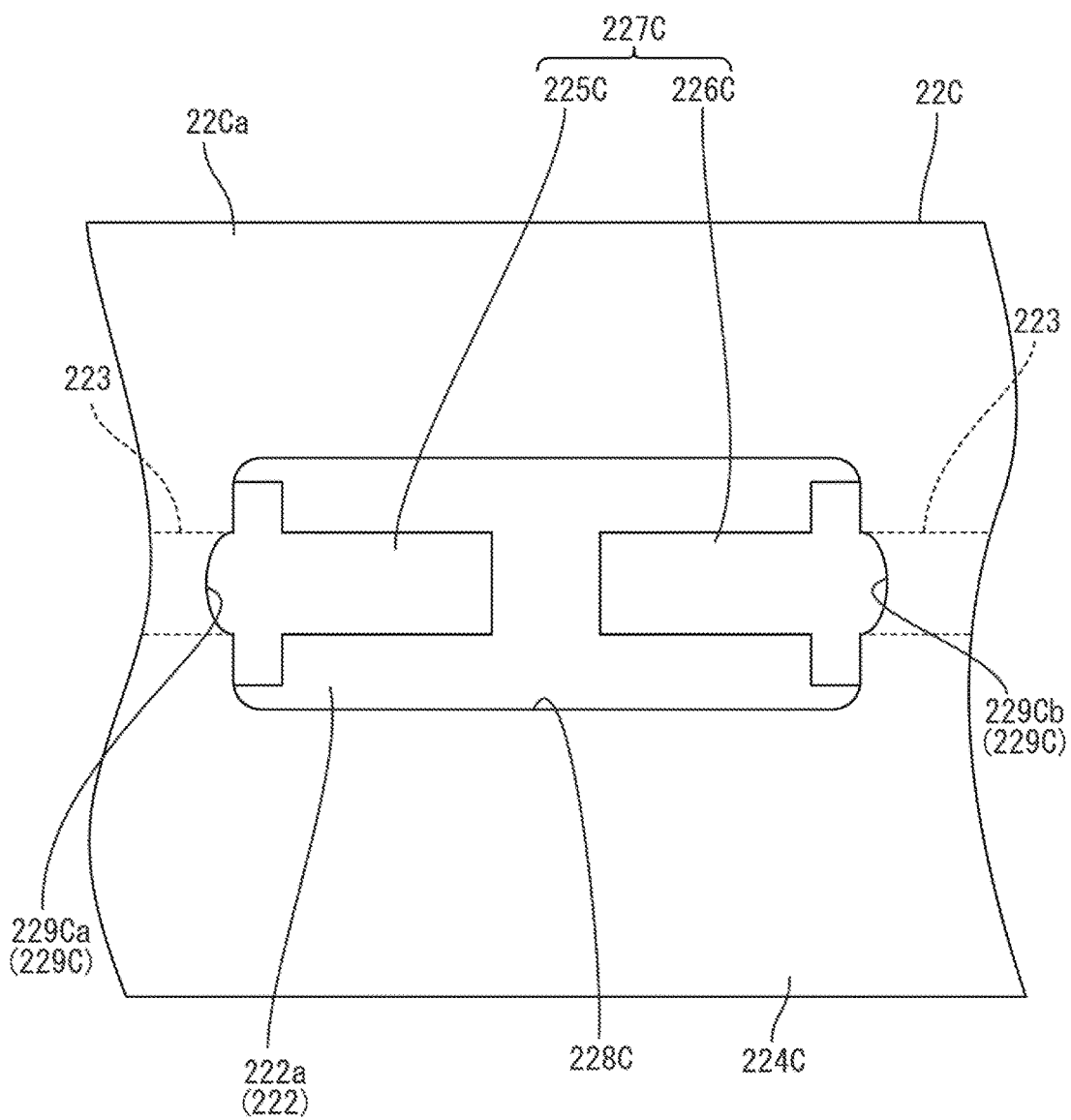
FIG. 12 is an enlarged view of a mounting portion having a pair of lands formed on the LED substrate according to the fourth embodiment.

FIG. 11 is an enlarged view of an LED 21 mounted on an LED substrate 22C of the LED unit 17C according to the fourth embodiment. FIG. 12 is an enlarged view of a mounting portion 227C having a pair of lands 225C and 226C formed on the LED substrate 22C according to the fourth embodiment.

As shown in FIG. 11, the LED 21 is mounted on the mounting portion 227C provided on a front surface 22Ca of the LED substrate 22C. The mounting portion 227C includes a pair of lands 225C and 226C. Before the LED 21 is mounted, the lands 225C and 226C supported on the support layer 222 (222a) are exposed inside the opening edges 228C provided in the cover layer 224C, as shown in FIG. 12.

The opening edges 228C as a whole form a horizontally long rectangular shape similarly to that of the first embodiment. Two portions along the short-side direction of the opening edges 228C configure locking edges 229C, 229C that overlap each of the lands 225C and 226C non-linearly in a plan view. The one that overlaps the anode-side land 225C may be referred to as locking edge 229Ca, and the one that overlaps the cathode-side land 226C may be referred to as locking edge 229Cb.

The locking edges 229Ca and 229Cb of this embodiment each include one each portion formed by a section of the opening edge 228C recessed from inside to outside in a semi-elliptic shape for each of the lands 225C and 226C. Therefore, as shown in FIG. 12, each of the lands 225C and 226C exposed inside the opening edges 228C includes a portion extended from inside to outside in a semi-elliptic shape, because of the locking edges 229Ca and 229Cb partly overlapping in a non-linear manner (in this embodiment, in a semi-elliptic shape).

The pair of lands 225C and 226C and the pair of terminals of the LED 21 (see the first embodiment) are electrically connected to each other by soldering via the solder portions 230C, 230C. The one that is used for the anode side may be referred to as solder portion 230Ca, and the one that is used for the cathode side may be referred to as solder portion 230Cb.

The solder portions 230C, 230C are provided on both sides of the LED 21 inside the opening edges 228C as shown in FIG. 11. The anode-side solder portion 230Ca conforms and adheres to the anode-side locking edge 229Ca. Therefore, a section of the solder portion 230Ca is recessed from inside to outside of the opening edge 228C in a semi-elliptic shape. The cathode-side solder portion 230Cb conforms and adheres to the cathode-side locking edge 229Cb. Therefore, a section of the solder portion 230Cb is also recessed from inside to outside of the opening edge 228C in a semi-elliptic shape.

Similarly to the first embodiment described above, the solder portions 230C, 230C mounted on the mounting portion 227C extend along the sides of the LED 21, and also somewhat upright from the LED substrate 22C. In a plan view, the solder portions 230C, 230C are longer than the short sides of the LED 21, with both ends of the solder portions 230C extending out from the LED 21.

In the LED unit 17C of this embodiment, in this way, the solder portion 230C and the opening edge 228C make close contact with each other non-linearly in a plan view so that the solder portion 230C and the locking edge 229C of the opening edge 228C are intertwined and interlocked with each other. Therefore, similarly to the first embodiment described above, stress hardly concentrates on the adhered joint between the solder portion 230C and the locking edge 229C so that the solder portion 230C and the locking edge 229C are hard to separate from each other.

As demonstrated in this embodiment, locking edges 229C that include a portion recessed from outside to inside in a semi-elliptic shape may be used.

Fifth Embodiment

Next, a fifth embodiment of the present invention will be described with reference to FIG. 13 and FIG. 14. This embodiment will describe an LED unit 17D having differently shaped locking edges 229D (opening edges 228D), and differently shaped lands 225D and 226D exposed inside the opening edges 228D.

Figure 13:
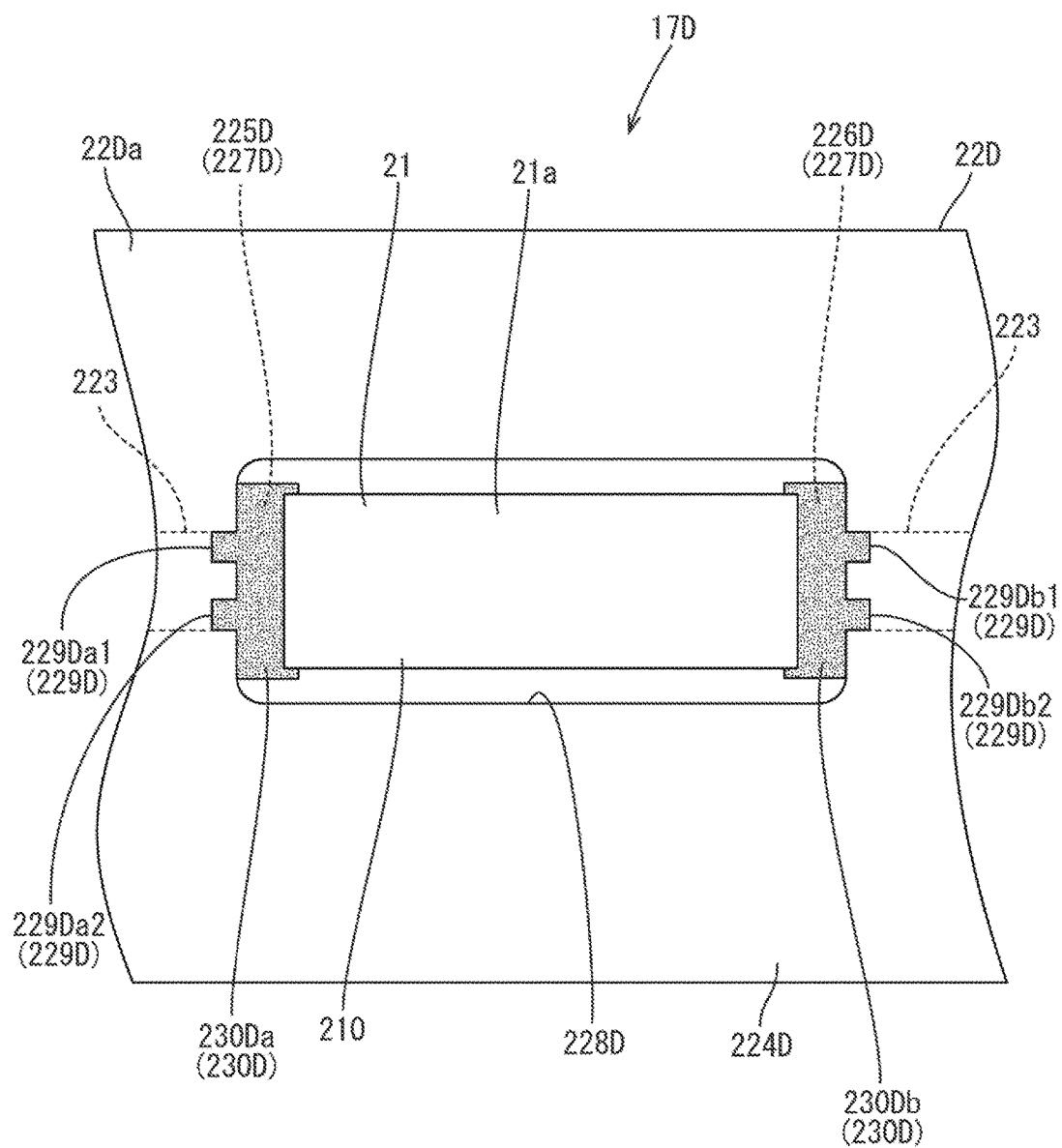
FIG. 13 is an enlarged view of an LED mounted on an LED substrate of an LED unit according to a fifth embodiment.
Figure 14:
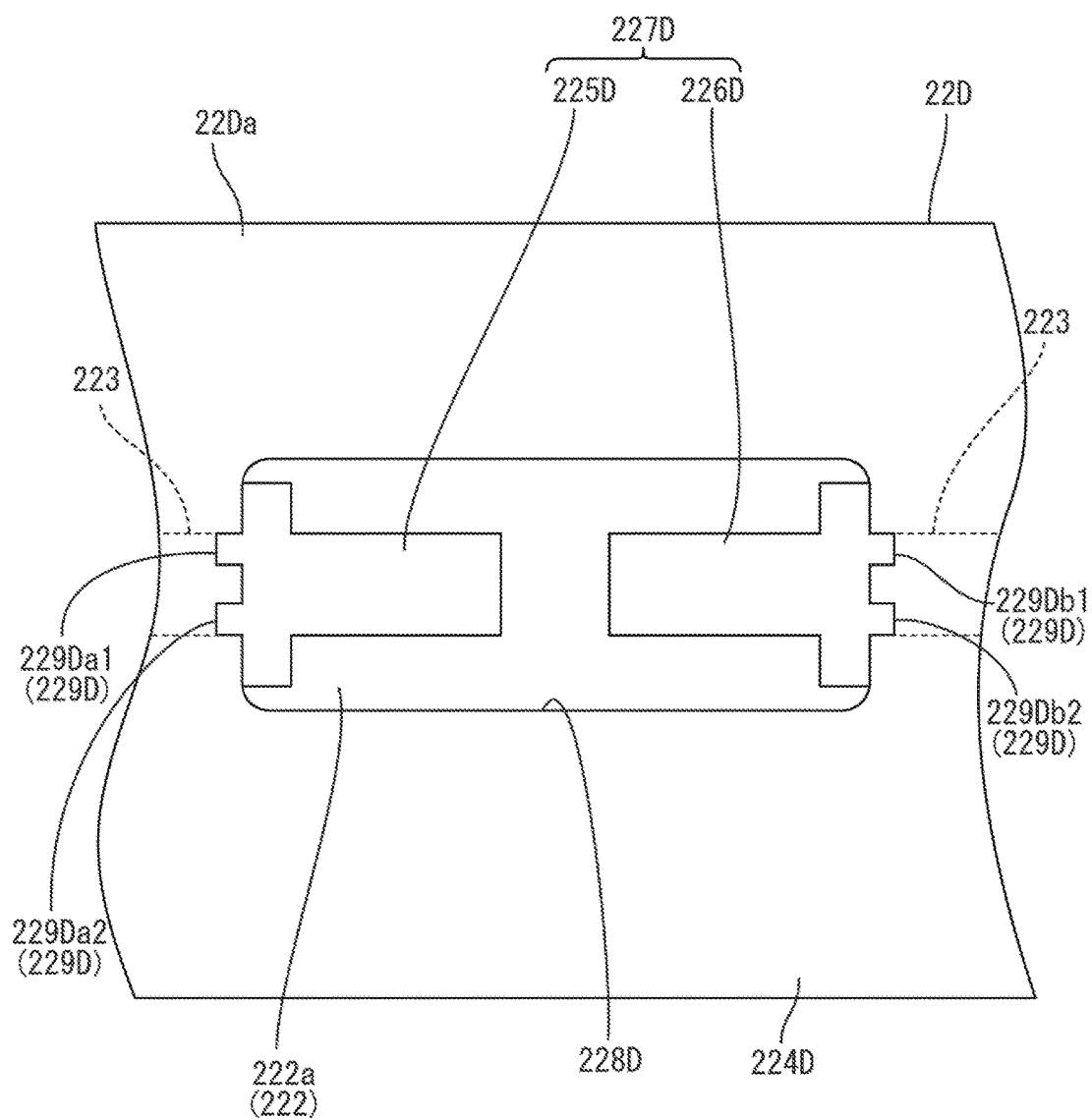
FIG. 14 is an enlarged view of the mounting portion having a pair of lands formed on the LED substrate according to the fifth embodiment.

FIG. 13 is an enlarged view of an LED 21 mounted on an LED substrate 22D of the LED unit 17D according to the fifth embodiment. FIG. 14 is an enlarged view of the mounting portion 227C having a pair of lands 225D and 226D formed on the LED substrate 22D according to the fifth embodiment.

As shown in FIG. 13, the LED 21 is mounted on a mounting portion 227D provided on a front surface 22Da of the LED substrate 22D. The mounting portion 227D includes a pair of lands 225D and 22DA. Before the LED 21 is mounted, the lands 225D and 226D supported on a support layer 222 (222a) are exposed inside the opening edges 228D provided in the cover layer 224D, as shown in FIG. 14.

The opening edges 228D as a whole form a horizontally long rectangular shape similarly to that of the first embodiment. Two portions along the short-side direction of the opening edges 228D configure locking edges 229D, 229D that overlap each of the lands 225D and 226D non-linearly in a plan view. The one that overlaps the anode-side land 225D may be referred to as locking edges 229Da1 and 229Da2, and the one that overlaps the cathode-side land 226D may be referred to as locking edges 229Db1 and 229Db2.

The locking edges 229D, 229D of this embodiment each include two portions where the opening edge 228D is recessed from inside to outside in a protruding (square) shape for each of the lands 225D and 226D. Therefore, as shown in FIG. 14, each of the lands 225B and 226B exposed inside the opening edges 228D includes two portions extended from inside to outside in a protruding (square) shape, because of the locking edges 229D, 229D partly overlapping in a non-linear manner (in this embodiment, in a shape with two square recesses spaced apart).

The pair of lands 225D and 226D and the pair of terminals of the LED 21 (see the first embodiment) are electrically connected to each other by soldering via the solder portions 230D, 230D. The one that is used for the anode side may be referred to as solder portion 230Da, and the one that is used for the cathode side may be referred to as solder portion 230Db.

The solder portions 230D, 230D are provided on both sides of the LED 21 inside the opening edges 228D as shown in FIG. 13. The anode-side solder portion 230Da conforms and adheres to the anode-side locking edge 229Da. Therefore, the solder portion 230Da includes two sections that are extended from inside to outside of the opening edge 228D in a protruding (square) shape.

The cathode-side solder portion 230Db conforms and adheres to the cathode-side locking edge 229Db. Therefore, the solder portion 230Db also includes two sections that are extended from inside to outside in a protruding (square) shape.

Similarly to the first embodiment described above, the solder portions 230D, 230D mounted on the mounting portion 227D extend along the sides of the LED 21, and also somewhat upright from the LED substrate 22D. In a plan view, the solder portions 230D, 230D are longer than the short sides of the LED 21, with both ends of the solder portions 230D, 230D extending out from the LED 21.

In the LED unit 17D of this embodiment, in this way, the solder portion 230D and the opening edge 228D make close contact with each other non-linearly in a plan view so that the solder portion 230D and the locking edge 229D of the opening edge 228D are intertwined and interlocked with each other. Therefore, similarly to the first embodiment described above, stress hardly concentrates on the adhered joint between the solder portion 230D and the locking edge 229D so that the solder portion 230D and the locking edge 229D are hard to separate from each other.

As demonstrated in this embodiment, locking edges 229D that include two (or more) portions recessed from inside to outside in a protruding (square) shape may be used.

Sixth Embodiment

Next, a sixth embodiment of the present invention will be described with reference to FIG. 15 and FIG. 16. This embodiment will describe an LED unit 17E having differently shaped locking edges 229E (opening edges 228E), and differently shaped lands 225E and 226E exposed inside opening edges 228E.

Figure 15:
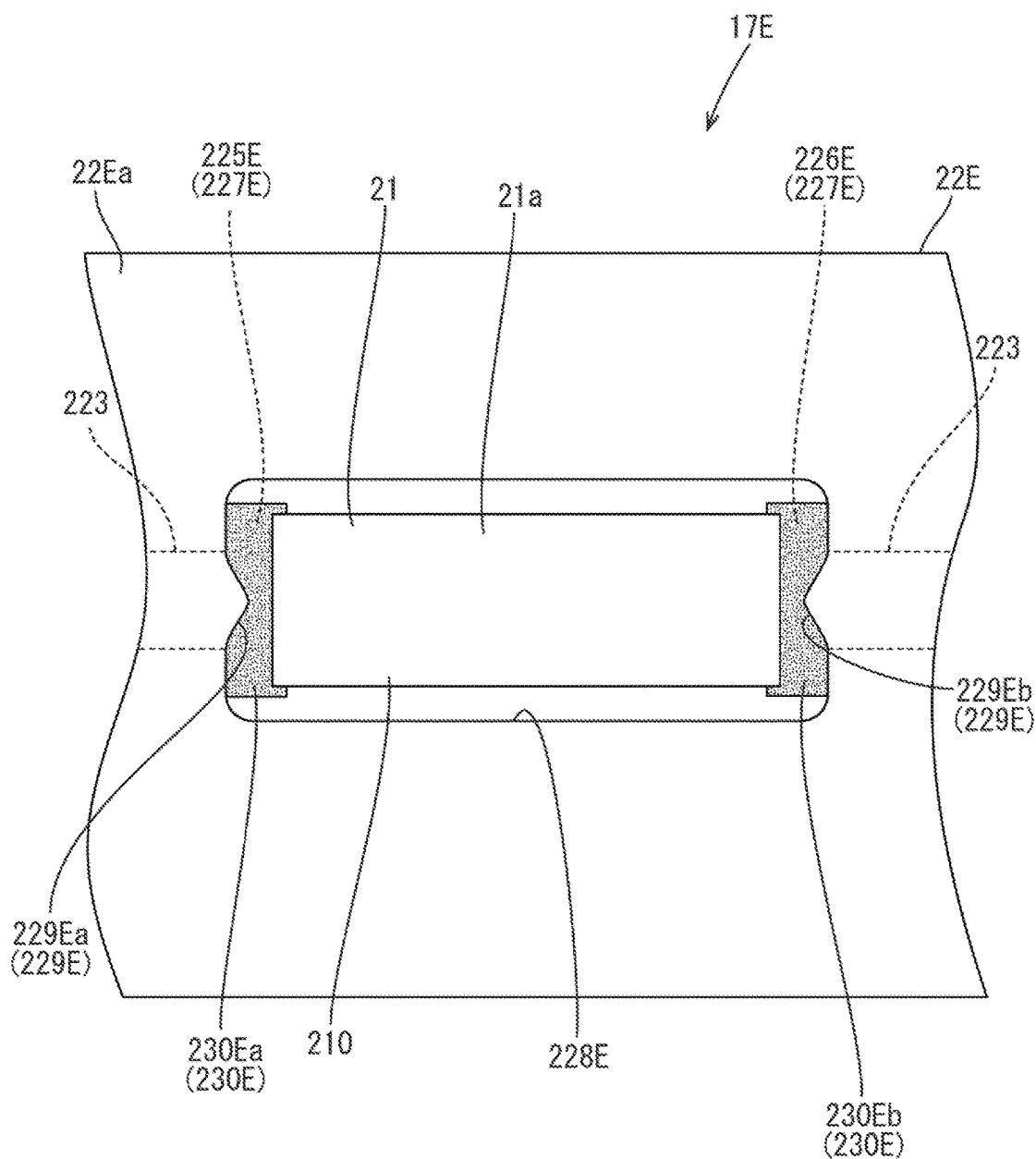
FIG. 15 is an enlarged view of an LED mounted on an LED substrate of an LED unit according to a sixth embodiment.
Figure 16:
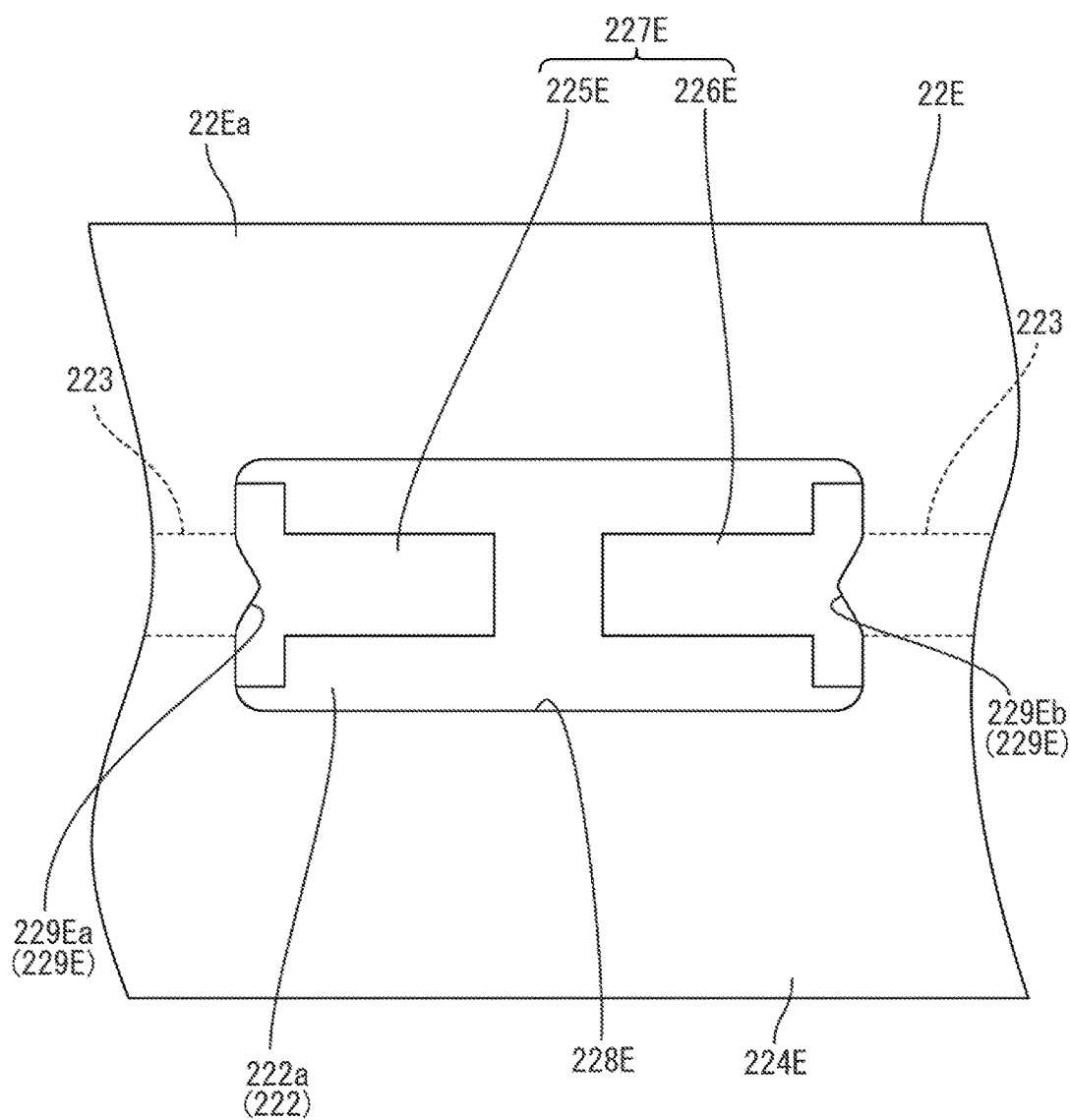
FIG. 16 is an enlarged view of a mounting portion having a pair of lands formed on the LED substrate according to the sixth embodiment.

FIG. 15 is an enlarged view of an LED 21 mounted on an LED substrate 22E of the LED unit 17E according to the sixth embodiment. FIG. 16 is an enlarged view of a mounting portion 227E having a pair of lands 225E and 226E formed on the LED substrate 22E according to the sixth embodiment.

As shown in FIG. 15, the LED 21 is mounted on the mounting portion 227E provided on the front surface 22Ea of the LED substrate 22E. The mounting portion 227E includes a pair of lands 225E and 226E. Before the LED 21 is mounted, the lands 225E and 226E supported on a support layer 222 (222a) are exposed inside the opening edges 228E provided in a cover layer 224E, as shown in FIG. 16.

The opening edges 228E as a whole form a horizontally long rectangular shape similarly to that of the first embodiment. Two portions along the short-side direction of the opening edges 228E configure locking edges 229E, 229E that overlap each of the lands 225E and 226E non-linearly in a plan view. The one that overlaps the anode-side land 225E may be referred to as locking edge 229Ea, and the one that overlaps the cathode-side land 226E may be referred to as locking edge 229Eb.

The locking edges 229Ea and 229Eb of this embodiment each include one each portion formed by a section of the opening edge 228E extended from outside to inside in a wave-like (chevron of sinusoidal wave) shape for each of the lands 225E and 226E. Therefore, as shown in FIG. 16, each of the lands 225E and 226E exposed inside the opening edges 228E includes a portion that is recessed from outside to inside in a wave-like (chevron of sinusoidal wave) shape, because of the locking edges 229Ea and 229Eb partly overlapping in a non-linear manner (in this embodiment, wave-like, or chevron shape of sinusoidal wave).

The pair of lands 225E and 226E and the pair of terminals of the LED 21 (see the first embodiment) are electrically connected to each other by soldering via the solder portions 230E, 230E. The one that is used for the anode side may be referred to as solder portion 230Ea, and the one that is used for the cathode side may be referred to as solder portion 230Eb.

The solder portions 230E, 230E are provided on both sides of the LED 21 inside the opening edges 228E as shown in FIG. 15. The anode-side solder portion 230Ea conforms and adheres to the anode-side locking edge 229Ea. Therefore, a section of the solder portion 230Ea is recessed from outside to inside of the opening edge 228E in a wave-like (chevron of sinusoidal wave) shape. The cathode-side solder portion 230Eb conforms and adheres to the cathode-side locking edge 229Eb. Therefore, a section of the solder portion 230Eb is also recessed from outside to inside of the opening edge 228E in a wave-like (chevron of sinusoidal wave) shape.

Similarly to the first embodiment described above, the solder portions 230E, 230E mounted on the mounting portion 227E extend along the sides of the LED 21, and also somewhat upright from the LED substrate 22E. In a plan view, the solder portions 230E, 230E are longer than the short sides of the LED 21, with both ends of the solder portions 230E extending out from the LED 21.

In the LED unit 17E of this embodiment, in this way, the solder portion 230E and the opening edge 228E make close contact with each other non-linearly in a plan view so that the solder portion 230E and the locking edge 229E of the opening edge 228EA are intertwined and interlocked with each other. Therefore, similarly to the first embodiment described above, stress hardly concentrates on the adhered joint between the solder portion 230E and the locking edge 229A so that the solder portion 230E and the locking edge 229E are hard to separate from each other.

As demonstrated in this embodiment, locking edges 229E that include a portion extended from outside to inside in a wave-like (chevron of sinusoidal wave) shape may be used.

Other Embodiments

The present invention is not limited to the embodiments illustrated by the description given above and the drawings. The following embodiments, for example, are also included in the technical scope of the present invention.

(1) While a one-sided FPC has been illustrated as the LED substrate of the LED unit in the embodiments described above, the present invention is not limited to this and other known FPCs such as double-sided FPCs, multilayer FPCs and the like may be used.

(2) While the locking edges are both in the same shape on the anode side and cathode side in the embodiments described above, the present invention is not limited to this and the locking edges may have different shapes on the anode side and cathode side.

(3) While one end face of the light guide plate is used as the light entering surface in the embodiments described above, the present invention is not limited to this, and two or more end faces may be used as light entering surfaces, for example. When two or more end faces are used as the light entering surfaces, light source units are to be prepared in accordance with the number of light entering surfaces.

(4) While the liquid crystal display device is portion of a car instrument panel in the embodiments described above, the present invention is not limited to this, and the liquid crystal display device may be used for other electronic equipment, for example, mobile information terminals such as smart phones and tablet terminals.

(5) While the color filters in the liquid crystal panel have three, R, G, and B, color units in the embodiments described above, the present invention is not limited to this. There may be four or more color units, for example.

(6) While TFTs are used as switching elements of the liquid crystal display device in the embodiments described above, the invention can be applied to liquid crystal display devices that use other switching elements than TFTs such as thin film diodes (TFDs). The invention is applicable also to liquid crystal display devices with a monotone display other than liquid crystal display devices with a color display.

(7) While the LED units as the light source units are used in the edge light type lighting device in the embodiments described above, the LED units may be used in other types of lighting devices as long as the object of the present invention is not compromised.

(8) While the locking edges in the sixth embodiment described above include a portion formed by a section of the opening edge extended from outside to inside in a wave-like shape, the locking edges may include a portion formed by a section of the opening edge recessed from inside to outside in a wave-like shape, for example, in other embodiments.

(9) While the locking edges in the second embodiment described above include a portion formed by a section of the opening edge extended from outside to inside in a semi-circular shape, the locking edges may include, for example, a portion formed by a section of the opening edge extended from outside to inside in a semi-elliptic shape, or, a portion formed by a section of the opening edge recessed from inside to outside in a semi-circular shape, in other embodiments.

EXPLANATION OF SYMBOLS

10: Liquid crystal display device (display device)
11: Liquid crystal panel (display panel)
12: Lighting device (backlight device)
13: Bezel
14: Chassis
15: Reflective sheet
16: Light guide plate
17: LED unit (light source unit)
18: Optical sheet
19: Frame
21: LED (light source)
22: LED substrate (light source substrate)
220: Substrate main body
221: Extended-out portion
222: Support layer
223: Wiring portion
224: Cover layer
225, 226: Land
227: Mounting portion
228: Opening edge
229: Locking edge
230: Solder

The invention claimed is:

1. A light source unit comprising:
a plurality of light sources each including a pair of terminals and aligned in a row; and
a light source substrate having flexibility including: a support layer having flexibility and an insulating property; a wiring portion formed on the support layer and for supplying power to the light sources; a plurality of mounting portions each including a pair of lands provided midway in the wiring portion and facing each other at a distance and each assigned to each of the light sources; an insulating cover layer formed on the support layer in such a way as to cover the wiring portion and including a plurality of opening edges for exposing the mounting portions; locking edges being a part of the opening edges and overlapping the lands in a non-linear manner in a plan view in each of the lands; and solder portions adhering along the locking edges and electrically connecting the lands to the terminals.

2. The light source unit according to claim 1, wherein the locking edges have a shape formed by a section of the opening edge recessed from inside to outside, and/or extended from outside to inside.

3. The light source unit according to claim 1, wherein the locking edges include a section of the opening edge recessed from inside to outside in a protruding shape.

4. The light source unit according to claim 1, wherein the locking edges include a section of the opening edge extended from outside to inside in a protruding shape.

5. The light source unit according to claim 1, wherein the locking edges include a section of the opening edge recessed from inside to outside in a pointed shape and a section of the opening edge extended from outside to inside in a pointed shape.

6. The light source unit according to claim 1, wherein the locking edges include a section of the opening edge recessed from inside to outside in a semi-circular or semi-elliptic shape.

7. The light source unit according to claim 1, wherein the locking edges include a section of the opening edge extended from outside to inside in a semi-circular or semi-elliptic shape.

8. The light source unit according to claim 1, wherein the locking edges include a section of the opening edge extended from outside to inside in a wave-like shape.

9. The light source unit according to claim 1, wherein the light sources comprise an LED.

10. A lighting device comprising:
the light source unit according to claim 1; and
a light guide plate being a plate-like member, the light guide plate including a light entering surface and a light exiting surface, the light entering surface being one of end surfaces of the plate-like member opposite the light sources of the light source unit through which light from the light sources enters, the light exiting surface being one of plate surfaces of the plate-like member through which the light entered through the light entering surface exit.

11. A display device comprising:
the lighting device according to claim 10; and
a display panel configured to display images using light from the lighting device.

12. The display device according to claim 11, wherein the display panel is a liquid crystal panel.

* * * * *